US011690213B2

(12) United States Patent
Lim et al.

(10) Patent No.: US 11,690,213 B2
(45) Date of Patent: Jun. 27, 2023

(54) SEMICONDUCTOR DEVICES HAVING A DECREASING HEIGHT GATE STRUCTURE

(71) Applicant: Samsung Electronics Co., Ltd., Suwon-si (KR)

(72) Inventors: Dongkyun Lim, Hwaseong-si (KR); Youngsin Kim, Hwaseong-si (KR); Kijin Park, Seoul (KR); Hoju Song, Seongnam-si (KR); Dongkwan Yang, Seoul (KR); Sangho Yun, Yongin-si (KR); Gyuhyun Lee, Seoul (KR); Jieun Lee, Yongin-si (KR); Seunguk Han, Suwon-si (KR); Yoongi Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 34 days.

(21) Appl. No.: 17/199,740

(22) Filed: Mar. 12, 2021

(65) Prior Publication Data

US 2022/0077152 A1  Mar. 10, 2022

(30) Foreign Application Priority Data

Sep. 7, 2020  (KR) .......................... 10-2020-0113854

(51) Int. Cl.
*H10B 12/00* (2023.01)
*H01L 29/78* (2006.01)
*H01L 29/49* (2006.01)
*H01L 29/66* (2006.01)

(52) U.S. Cl.
CPC ....... *H10B 12/315* (2023.02); *H01L 29/4941* (2013.01); *H01L 29/66484* (2013.01); *H01L 29/7831* (2013.01); *H01L 29/7833* (2013.01)

(58) Field of Classification Search
CPC ........... H01L 27/10814; H01L 29/4941; H01L 29/66484; H01L 29/7831; H01L 29/7833
See application file for complete search history.

(56) References Cited

U.S. PATENT DOCUMENTS

| 6,767,787 | B2 | 7/2004 | Koh et al. |
| 6,979,520 | B2 | 12/2005 | Noguchi |
| 7,229,502 | B2 | 6/2007 | Wang et al. |
| 7,544,556 | B1 * | 6/2009 | Mui ................. H01L 21/28512 |
| | | | 438/585 |
| 7,709,862 | B2 | 5/2010 | Nonaka et al. |

(Continued)

FOREIGN PATENT DOCUMENTS

| KR | 100351055 B1 | 9/2002 |
| KR | 100474505 B1 | 5/2005 |

(Continued)

*Primary Examiner* — Matthew E Warren
(74) *Attorney, Agent, or Firm* — Myers Bigel, P.A.

(57) ABSTRACT

A semiconductor device includes a gate structure on a substrate, first and second spacer structures on first and second sidewalls, respectively, opposite to each other of the gate structure, and first and second source/drain layers at upper portions of the substrate adjacent to the first and second sidewalls, respectively, of the gate structure. An upper surface of the gate structure has a height with reference to an upper surface of the substrate being a base level decreasing from a central portion to the first sidewall and substantially constant from the central portion to the second sidewall.

17 Claims, 23 Drawing Sheets

(56) References Cited

U.S. PATENT DOCUMENTS

| | | |
|---|---|---|
| 8,105,927 B2 | 1/2012 | Nonaka et al. |
| 8,202,791 B2 | 6/2012 | Chuang et al. |
| 9,305,802 B2 | 4/2016 | Kim et al. |
| 9,443,770 B2 | 9/2016 | Dong et al. |
| 9,530,887 B1 * | 12/2016 | Chang ............... H01L 21/76831 |
| 9,613,811 B2 | 4/2017 | Baek et al. |
| 9,620,551 B2 | 4/2017 | Tseng et al. |
| 10,868,233 B2 | 12/2020 | Ouellette et al. |
| 2004/0232493 A1 | 11/2004 | Koh et al. |
| 2005/0017312 A1 | 1/2005 | Jeng et al. |
| 2009/0325106 A1 | 12/2009 | Conley et al. |
| 2011/0316093 A1 * | 12/2011 | Yang ............... H01L 21/823807 257/408 |
| 2012/0068270 A1 * | 3/2012 | Gotou ............ H01L 21/823418 257/E21.409 |
| 2017/0103916 A1 * | 4/2017 | Jeon ................ H01L 21/823475 |
| 2018/0315764 A1 * | 11/2018 | Yang ................ H01L 29/42344 |

FOREIGN PATENT DOCUMENTS

| | | |
|---|---|---|
| KR | 100898676 B1 | 5/2009 |
| KR | 101075080 B1 | 10/2011 |
| KR | 101161456 B1 | 7/2012 |
| TW | 201742278 A | 12/2017 |

\* cited by examiner

SEMICONDUCTOR DEVICES HAVING A DECREASING HEIGHT GATE STRUCTURE

CROSS-REFERENCE TO RELATED APPLICATION

This application claims priority under 35 U.S.C. § 119 to Korean Patent Application No. 10-2020-0113854 filed on Sep. 7, 2020 in the Korean Intellectual Property Office, the disclosure of which is hereby incorporated by reference in its entirety.

TECHNICAL FIELD

Example embodiments of the inventive concept relate to a semiconductor device. More particularly, example embodiments of the inventive concept relate to a transistor including source/drain layers.

BACKGROUND

When transistors are formed in a peripheral circuit region of a DRAM device, gate structures are formed on a substrate, and source/drain layers are formed at upper portions of the substrate adjacent to the gate structures. The source/drain layers may be formed by forming a photoresist pattern serving as an ion implantation mask on the substrate, and then performing an ion implantation process. The photoresist pattern may be formed by forming a photoresist layer on the substrate to cover the gate structures, and then performing an exposure process and a developing process on the photoresist layer so that an opening may be formed through the photoresist layer to expose an area between the gate structures. Recently, as the distance between the gate structures decreases, the opening through the photoresist layer may have a reduced size, which may be difficult to form due to the resolution limit of the exposure process using KrF laser equipment.

SUMMARY

Example embodiments provide a semiconductor device having improved characteristics.

According to example embodiments of the inventive concepts, there is a semiconductor device. The semiconductor device may include a gate structure on a substrate, first and second spacer structures on first and second sidewalls, respectively, opposite to each other of the gate structure, and first and second source/drain layers at upper portions of the substrate adjacent to the first and second sidewalls, respectively, of the gate structure. An upper surface of the gate structure may have a height with reference to an upper surface of the substrate being a base level decreasing from a central portion to the first sidewall and substantially constant from the central portion to the second sidewall.

According to example embodiments of the inventive concepts, there is a semiconductor device. The semiconductor device may include first, second and third gate structures spaced apart from each other on a substrate, first and second spacer structures on first and second sidewalls, respectively, opposite to each other of each of the first, second, and third gate structures, and first, second, third and fourth source/drain layers at upper portions of the substrate between the first and second gate structures, between the second and third gate structures, at one side of the first gate structure, and at one side of the third gate structure, respectively. The first and second gate structures may be spaced apart from each other by a first distance, and the second and third gate structures may be spaced apart from each other by a second distance greater than the first distance. An uppermost surface of the first spacer structure on the first sidewall of the second gate structure facing the first gate structure may be lower than an uppermost surface of the second spacer structure on the second sidewall of the second gate structure with reference to an upper surface of the substrate being a base level.

According to example embodiments of the inventive concepts, there is a semiconductor device. The semiconductor device may include first and second active patterns on a cell region and a peripheral circuit region surrounding the cell region in a plan view of the semiconductor device, respectively, of a substrate, a first gate structure buried at an upper portion of the first active pattern, a bit line structure physically contacting a central upper surface of the first active pattern, a contact plug structure physically contacting each of opposite edge upper surfaces of the first active pattern, a capacitor on the contact plug structure, a second gate structure on the second active pattern, first and second spacer structures on first and second sidewalls, respectively, opposite to each other of the second gate structure, and first and second source/drain layers at upper portions of the substrate adjacent to the first and second sidewalls, respectively, of the second gate structure. An upper surface of the second gate structure may have a height gradually decreasing from a central portion to the first sidewall and substantially constant from the central portion to the second sidewall with reference to an upper surface of the substrate being a base level.

In the method of manufacturing the semiconductor device, when the source/drain layer is formed by an ion implantation process on the upper portion of the substrate between the gate structures that are spaced apart from each other by a small distance, a photoresist pattern is not used alone as an ion implantation process but a mask layer having a flat upper surface may be further formed under the photoresist pattern. Thus, when the photoresist layer is patterned using ArF laser equipment having an enhanced resolution, the diffused reflection due to the gate structures may be reduced or prevented so that the opening may be formed to have a desired size through the photoresist pattern, and the mask layer may be patterned using the photoresist pattern as an etching mask to form an ion implantation mask, which may be used for forming the source/drain layer.

Additionally, an etch stop layer may be further formed on an upper surface of the substrate between the gate structures, which may not be removed but remain when the mask layer is etched to form a mask, and thus may protect the upper surface of the substrate during the ion implantation process.

DETAILED DESCRIPTION

Figure 1:
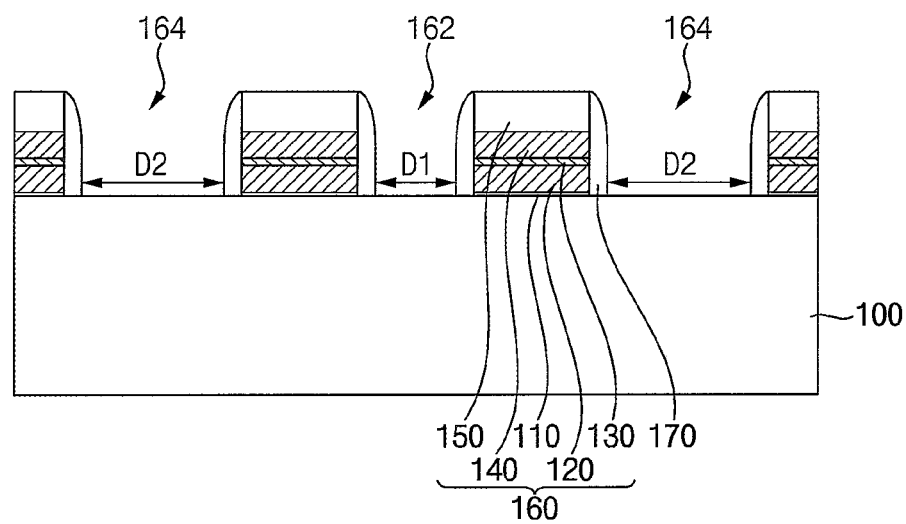
FIGS. 1 to 9 are cross-sectional views illustrating a method of manufacturing a semiconductor device in accordance with example embodiments of the inventive concept.

The above and other aspects and features of a method of cutting a fine pattern, a method of forming active patterns using the same, and a method of manufacturing a semiconductor device using the same in accordance with example embodiments will become readily understood from detail description that follows, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts. The same reference numerals are used for the same elements in the drawings, and redundant descriptions thereof will be omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIGS. 1 to 9 are cross-sectional views illustrating a method of manufacturing a semiconductor device in accordance with example embodiments of the inventive concept.

Referring to FIG. 1, a gate structure 160 may be formed on a substrate 100, and a gate spacer 170 may be formed on a sidewall of the gate structure 160.

The substrate 100 may include silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

The gate structure 160 may include a gate insulation pattern 110, a first conductive pattern 120, a diffusion barrier 130, a second conductive pattern 140, and a gate mask 150 sequentially stacked.

The gate insulation pattern 110 may include an oxide, e.g., silicon oxide, the first conductive pattern 120 may include, e.g., doped polysilicon, the diffusion barrier 130 may include a metal silicon nitride, e.g., titanium silicon nitride, the second conductive pattern 140 may include a metal, e.g., tungsten, and the gate mask 150 may include a nitride, e.g., silicon nitride.

The gate spacer 170 may be formed by forming a gate spacer layer on the substrate 100 having the gate structure 160 thereon, and anisotropically etching the gate spacer layer. The gate spacer 170 may include a nitride, e.g., silicon nitride.

In example embodiments, a plurality of gate structures 160 may be formed to be spaced apart from each other, and some of the plurality of gate structures 160 may be spaced apart from each other by a relatively small distance and some of the plurality of gate structures 160 may be spaced apart from each other by a relatively large distance. FIG. 1 shows four gate structures 160, and hereinafter, two central structures among four structures each including the gate structure 160 and the gate spacer 170 on each of opposite sidewalls thereof may be referred to as first structures, respectively, and the other two edge structures among the four structures may be referred to as second and third structures, respectively.

A first opening 162 may be formed between the first structures, and a second opening 164 may be formed between the first and second structures and between the first and third structures. In example embodiments, a width of the first opening 162, that is, a first distance D1 between the first structures may be smaller than a width of the second opening 164, that is, a second distance D2 between the first and second structures or between the first and third structures.

Figure 2:
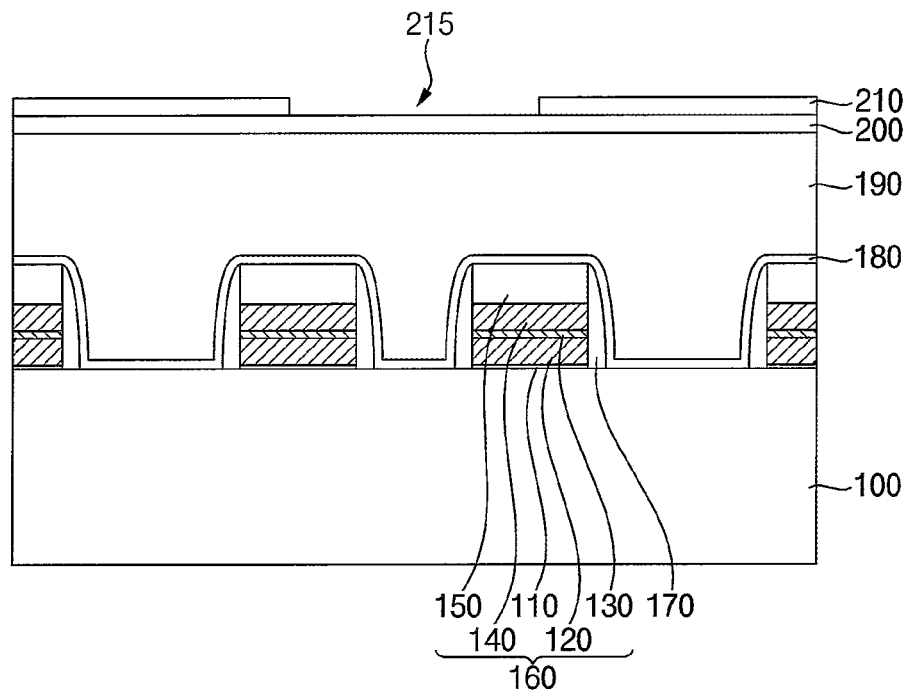

Referring to FIG. 2, an etch stop layer 180 may be formed on the substrate 100 to at least partially cover the first to third structures, and a first mask layer 190, a second mask layer 200, and a first photoresist pattern 210 may be sequentially formed on the etch stop layer 180.

In example embodiments, the etch stop layer 180 may include a material having a high etching selectivity with respect to the first mask layer 190, e.g., silicon oxide or a metal oxide, such as titanium oxide ($TiO_2$). The etch stop layer 180 may be formed e.g., by using an atomic layer deposition (ALD) process.

In example embodiments, the first mask layer 190 may include a material that may be easily removed by an ashing process and/or a stripping process, e.g., spin on hardmask (SOH) or amorphous carbon layer (ACL).

In example embodiments, the second mask layer 190 may include a material having a high etching selectivity with respect to the first mask layer 190, e.g., plasma enhanced silicon oxynitride (PE-SiON).

In example embodiments, the first photoresist pattern 210 may be formed by forming a first photoresist layer on the second mask layer 200, and patterning the first photoresist layer through an exposure process using, e.g., argon fluoride (ArF) laser equipment, and a developing process. The first photoresist pattern 210 may include a third opening 215 overlapping the first opening 162 in a vertical direction substantially perpendicular to an upper surface of the substrate 100, and the third opening 215 may also overlap in the vertical direction a portion of each of the first structures adjacent to the first opening 162.

The first photoresist pattern 210 may be formed by the exposure process using argon fluoride (ArF) laser equipment, and thus the third opening 215 may have a relatively small size when compared to one formed using, e.g., krypton fluoride (KrF) laser equipment. The first and second mask layers 190 and 200 have been formed under the first photoresist pattern 210, and thus the exposure process may not be affected by diffused reflection due to the underlying first structures.

Figure 3:
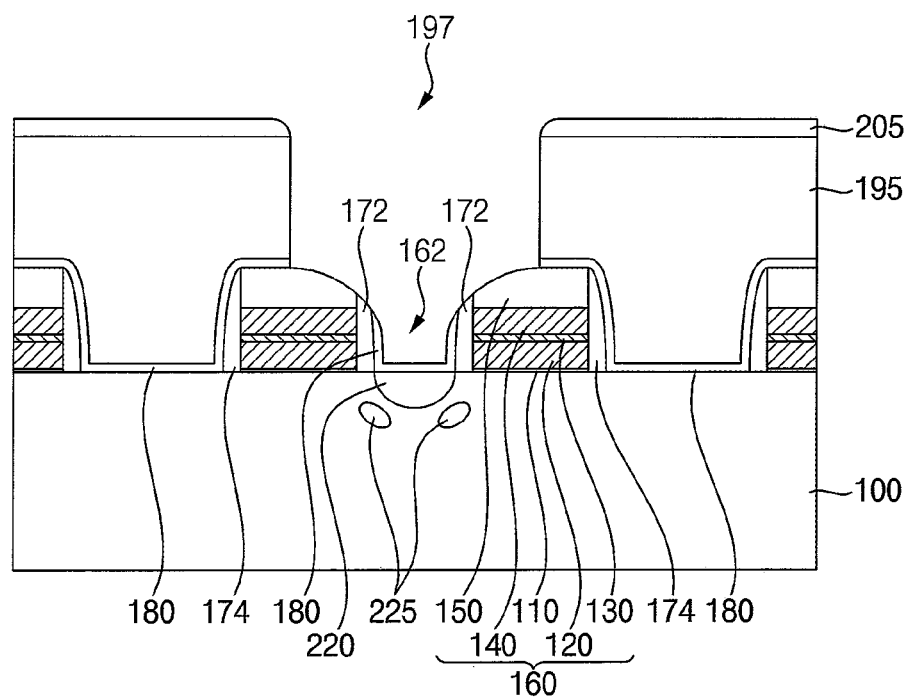

Referring to FIG. 3, the second mask layer 200 may be etched using the first photoresist pattern 210 as an etching mask to form a second mask 205, and the first mask layer 190 may be etched using the second mask 205 as an etching mask to form a first mask 195.

By the etching process, a fourth opening 197 may be formed through the first mask 195, and the first opening 162 may be formed again to be connected with the fourth opening 197 between the first structures. During the etching process, portions of the etch stop layer 180 on a sidewall and an upper surface of an upper portion of each of the first structures adjacent to the first opening 162 may be removed, however, portions of the etch stop layer 180 on a sidewall of a lower portion of each of the first structures and on an upper surface of the substrate 100 may not be removed but remain. Additionally, during the etching process, an upper portion of the gate spacer 170 and an upper portion of the gate mask 150 in each of the first structures may be partially removed.

Accordingly, a portion of the gate mask 150 adjacent to the first opening 162 and a portion of the gate mask 150 distal to the first opening 162 in each of the first structures may have different shapes from each other. That is, the portion of the gate mask 150 distal to the first opening 162 may have a constant thickness and a flat upper surface, however, the portion of the gate mask 150 adjacent to the first opening 162 may have a decreasing thickness when approaching the first opening 162 so that an upper surface thereof may bend towards the substrate 100 when approaching the first opening 162.

Hereinafter, a portion of the gate spacer 170 adjacent to the first opening 162 in each of the first structures may be referred to as a first spacer 172, and a portion of the gate spacer 170 distal to the first opening 162 in each of the first structures may be referred to as a second spacer 174. An uppermost surface of the first spacer 172 may be lower than an uppermost surface of the second spacer 174 in the cross-sectional view of FIG. 3.

During the etching process, the first photoresist pattern 210 may be mostly removed, however, if some portions of the first photoresist pattern 210 remain, a cleaning process may be further performed to remove the remaining portions of the first photoresist pattern 210.

A first ion implantation process may be performed to form a first impurity region 220 at an upper portion of the substrate 100 between the first structures, and a second ion implantation process may be performed to form a second impurity region 225 at a portion of the substrate 100 under the first impurity region 220. Each of the first and second ion implantation processes may be performed using the first structures and the first and second masks 195 and 205 as an ion implantation mask.

In an example embodiment, n-type impurities having a first concentration may be doped into the upper portion of the substrate 100 by the first ion implantation process to form the first impurity region 220, and p-type impurities may be doped into the portion of the substrate 100 by the second ion implantation process to form the second impurity region 225. Alternatively, p-type impurities having a first concentration may be doped into the upper portion of the substrate 100 by the first ion implantation process to form the first impurity region 220, and n-type impurities may be doped into the portion of the substrate 100 by the second ion implantation process to form the second impurity region 225.

In example embodiments, the second impurity region 225 may be formed under the first impurity region 220, e.g., at a portion of the substrate 100 adjacent to each of opposite lower sidewall of the first impurity region 220 as shown in FIG. 3.

When each of the first and second ion implantation process is performed, the etch stop layer 180 may remain on the upper surface of the substrate 100 so that the substrate 100 may not be damaged.

Figure 4:
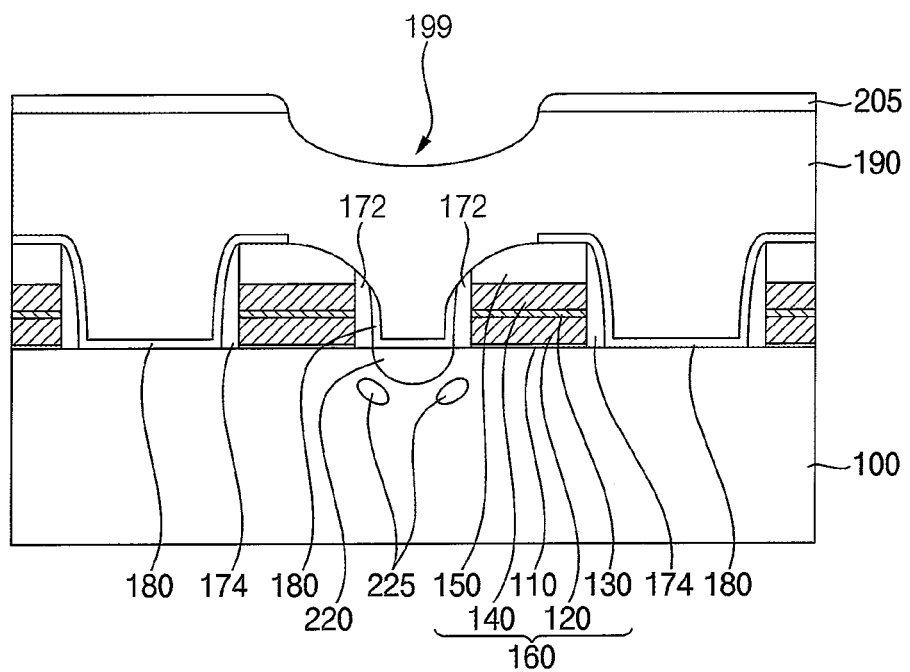

Referring to FIG. 4, the first mask layer 190 may be further formed on the second mask 205 to at least partially fill the first and fourth openings 162 and 197, and an upper portion of the first mask layer 190 may be partially removed by an etch back process.

Thus, the first and fourth openings 162 and 197 may be at least partially filled with the first mask layer 190, and the second mask 205 may be exposed. A recess 199 may be formed on an upper surface of the first mask layer 190 not covered by the second mask 205, i.e., free of the second mask 205.

The etch back process may be performed by, e.g., a dry etching process.

Figure 5:
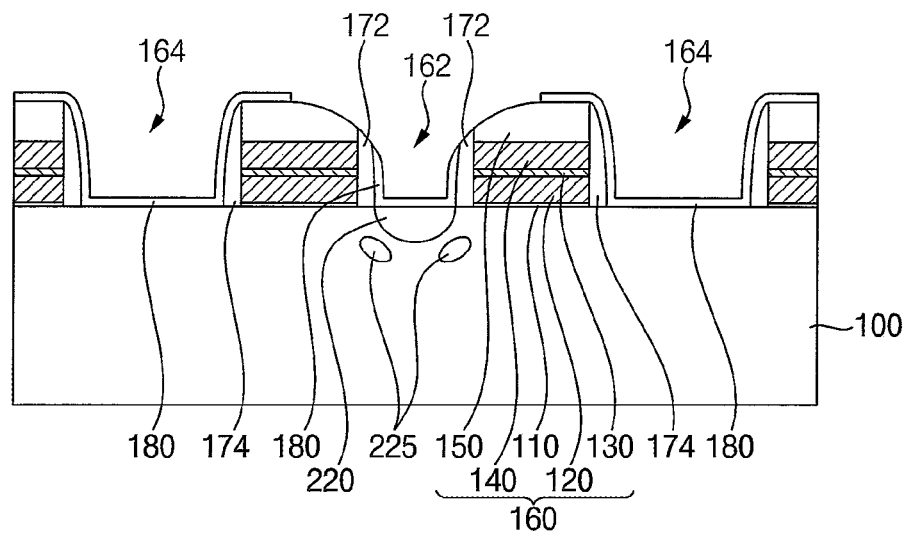

Referring to FIG. 5, after removing the second mask 205, the first mask layer 190 may be removed, and thus the first to third structures and the etch stop layer 180 may be exposed on the substrate 100.

The second mask 205 may be removed by a dry etching process or a wet etching process, and the first mask layer 190 may be removed by an ashing process and/or a stripping process.

Figure 6:
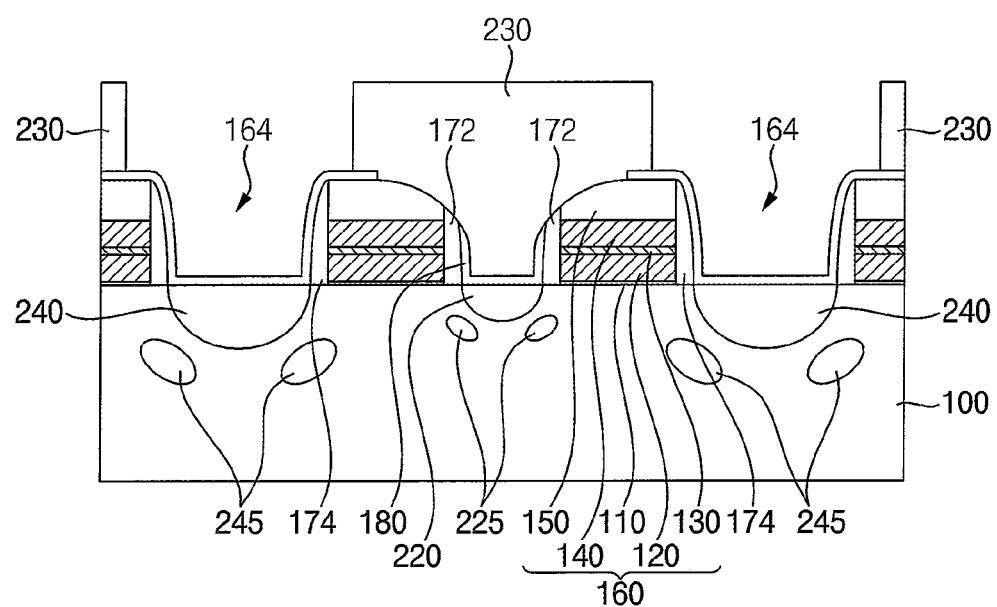

Referring to FIG. 6, a second photoresist pattern 230 exposing the second opening 164 may be formed on the substrate 100, the first to third structures, and the etch stop layer 180.

The second photoresist pattern 230 may be formed by forming a second photoresist layer, performing an exposure process on the second photoresist layer using, e.g., ArF laser equipment, and performing a developing process thereon. The second opening 164 may have a width smaller than that of the first opening 162, and thus the exposure process may not be affected by diffused reflection due to the underlying first and second structures or the underlying first and third structures. Accordingly, unlike the first photoresist pattern 210 for exposing the first opening 162 having a relatively small width, the first and second mask layers 190 and 200 may not be further formed between the substrate 100 and the second photoresist pattern 230, and the second photoresist pattern 230 alone may serve as an ion implantation mask.

In other embodiments, the exposure process may be performed using KrF laser equipment.

A third ion implantation process may be performed to form a third impurity region at an upper portion of the substrate 100 between the first and second structures or between the first and third structures, and a fourth ion implantation process may be performed to form a fourth impurity region at a portion of the substrate 100 under the third impurity region 240. Each of the third and fourth ion implantation processes may be performed using the first to third structures and the second photoresist pattern 230 as an ion implantation mask. In example embodiments, the fourth impurity region 245 may be formed under the third impurity region 240, e.g., at a portion of the substrate 100 adjacent to each of opposite lower sidewalls of the third impurity region 240.

In an example embodiment, n-type impurities having a second concentration may be doped into the upper portion of the substrate 100 by the third ion implantation process to form the third impurity region 240, and p-type impurities may be doped into the portion of the substrate 100 by the fourth ion implantation process to form the fourth impurity region 245. Alternatively, p-type impurities having a second concentration may be doped into the upper portion of the substrate 100 by the third ion implantation process to form the third impurity region 240, and n-type impurities may be doped into the portion of the substrate 100 by the fourth ion implantation process to form the fourth impurity region 245.

Figure 7:
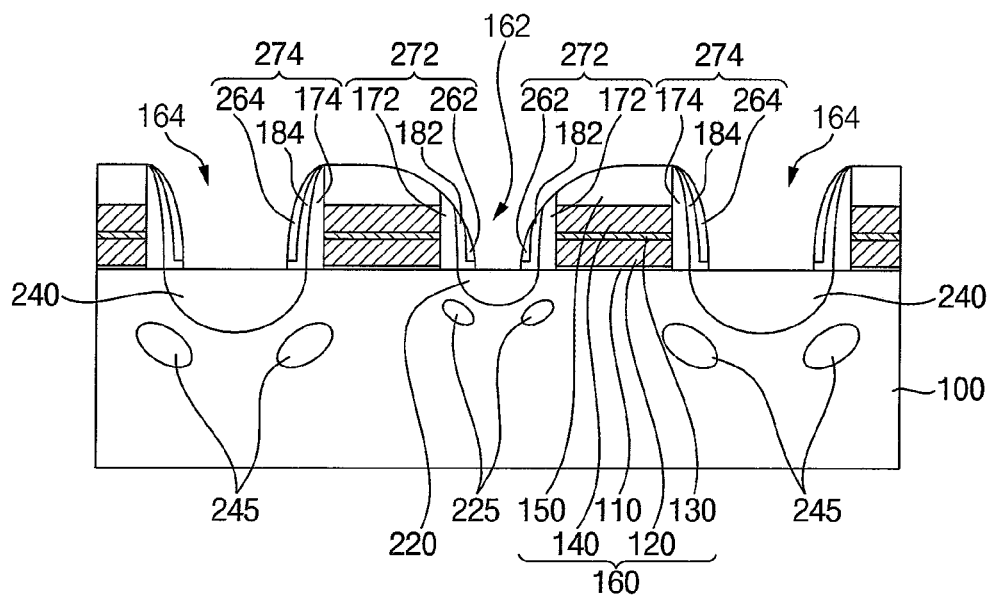

Referring to FIG. 7, after removing the second photoresist pattern 230, the first and second spacer structures 272 and 274 may be formed.

The second photoresist pattern 230 may be removed by, e.g., an ashing process and/or a stripping process.

The first and second spacer structures 272 and 274 may be formed by forming a spacer layer on the substrate 100 to at least partially cover the first to third structures and the etch stop layer 180, and anisotropically etching the spacer layer. During the anisotropic etching process, portions of the spacer layer on upper surfaces of the first to third structures and an upper surface of the substrate 100, and portions of the etch stop layer 180 on the upper surfaces of the first to third structures and the upper surface of the substrate 100 may be removed.

In example embodiments, the spacer layer may include an oxide, e.g., silicon oxide, and if the etch stop layer 180 includes silicon oxide, the spacer layer may be merged with the etch stop layer 180 to form a monolithic layer.

Accordingly, a first etch stop pattern 182 and a third spacer 262 may be formed on a sidewall of each of the first structures adjacent to the first opening 162, and a second etch stop pattern 184 and a fourth spacer 264 may be formed on a sidewall of each of the first structures distal to the first opening 162, that is, on a sidewall of each of the first structures adjacent to the second opening 164.

The first spacer 172, the first etch stop pattern 182 and the third spacer 262 may be sequentially stacked in a horizontal direction in the cross-sectional view of FIG. 7 substantially parallel to the upper surface of the substrate 100 on a sidewall of the gate structure 160 adjacent to the first opening 162 in each of the first structures, which may be referred to as a first spacer structure 272. Additionally, the second spacer 174, the second etch stop pattern 184 and the fourth spacer 264 may be sequentially stacked in the horizontal direction in the cross-sectional view of FIG. 7 on a sidewall of the gate structure 160 adjacent to the second opening 164 in each of the first structures, which may be referred to as a second spacer structure 274.

As illustrated above with reference to FIG. 7, the uppermost surface of the first spacer 172 may be lower than the uppermost surface of the second spacer 174, and uppermost surfaces of the first etch stop pattern 182 and the third spacer 262 may be lower than uppermost surfaces of the second etch stop pattern 184 and the fourth spacer 264. Each of the first and second etch stop patterns 182 and 184 may have a cross-section in a direction of an "L" shape.

The second spacer structure 274 including the second spacer 174, the second etch stop pattern 184, and the fourth spacer 264 sequentially stacked in the horizontal direction in the cross-sectional view of FIG. 7 may be also formed on a sidewall of the gate structure 160 adjacent to the second opening 164 in each of the second and third structures. Additionally, the second spacer 274 may be formed also on a sidewall of the gate structure 160 distal to the second opening 164 in each of the second and third structures.

Figure 8:
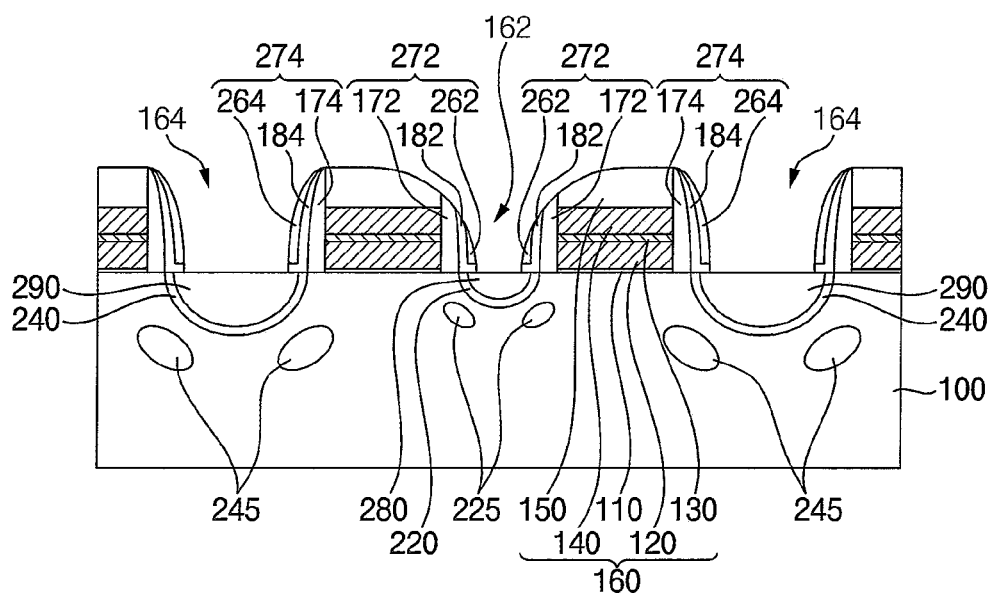

Referring to FIG. 8, a fifth ion implantation process may be performed to form a fifth impurity region 280 at an upper portion of the substrate 100 between the first structures, and a sixth impurity region 290 at an upper portion of the substrate 100 between the first and second structures and between the first and third structures.

When the fifth ion implantation process is performed, a third photoresist pattern (not shown) partially covering the first to third structures and exposing the first and second openings 162 and 164 may be formed, and may serve as an ion implantation mask. An exposure process for forming the third photoresist pattern may be performed using, e.g., ArF laser equipment.

As illustrated above, the second opening 164 may have a relatively small width, and thus, even though the exposure process is performed using ArF laser equipment, the exposure process may not be affected by diffused reflection due to the first and second structures or the first and third structures adjacent to the second opening 164. Even though the first opening 162 has a relatively small width, the first spacer structure 272 may be formed in the first opening 162, and an upper portion of the first opening 162 may have a width greater than that of a lower portion of the first opening 162 and an upper surface of the first spacer structure 272 may have a gentle slope, which may reduce the influence of the diffused reflection. Accordingly, the third photoresist pattern alone may serve as an ion implantation mask for the fifth ion implantation process.

The fifth and sixth impurity regions 280 and 290 may be simultaneously formed or formed in concert with one another by the fifth ion implantation process, or independently formed by fifth and sixth ion implantation processes, respectively. If the fifth and sixth impurity regions 280 and 290 are formed by the fifth and sixth ion implantation processes, respectively, an exposure process for forming a fourth photoresist pattern (not shown) serving as an ion implantation mask during the sixth ion implantation process may be performed using, e.g., ArF laser equipment or KrF laser equipment.

In example embodiments, the fifth impurity region 280 may be formed in the first impurity region 220, and may be formed by doping impurities having the same conductivity type as those of the first impurity region 220. A third concentration of the fifth impurity region 280 may be greater than the first concentration of the first impurity region 220. Additionally, the sixth impurity region 290 may be formed in the third impurity region 240, and may be formed by doping impurities having the same conductivity type as those of the third impurity region 240. A fourth concentration of the sixth impurity region 290 may be greater than the second concentration of the third impurity region 240.

Accordingly, the first and fifth impurity regions 220 and 280 and the third and sixth impurity regions 240 and 290 may form source/drain layers, respectively, each of which may have a lightly doped drain (LDD) structure, and each of the second and fourth impurity regions 225 and 245 may be a halo region. Hereinafter, one of the source/drain layers under the first opening 162 may be referred to as a first source/drain layer, and one of the source/drain layers under the second opening 164 may be referred to as a second source/drain layer.

Figure 9:
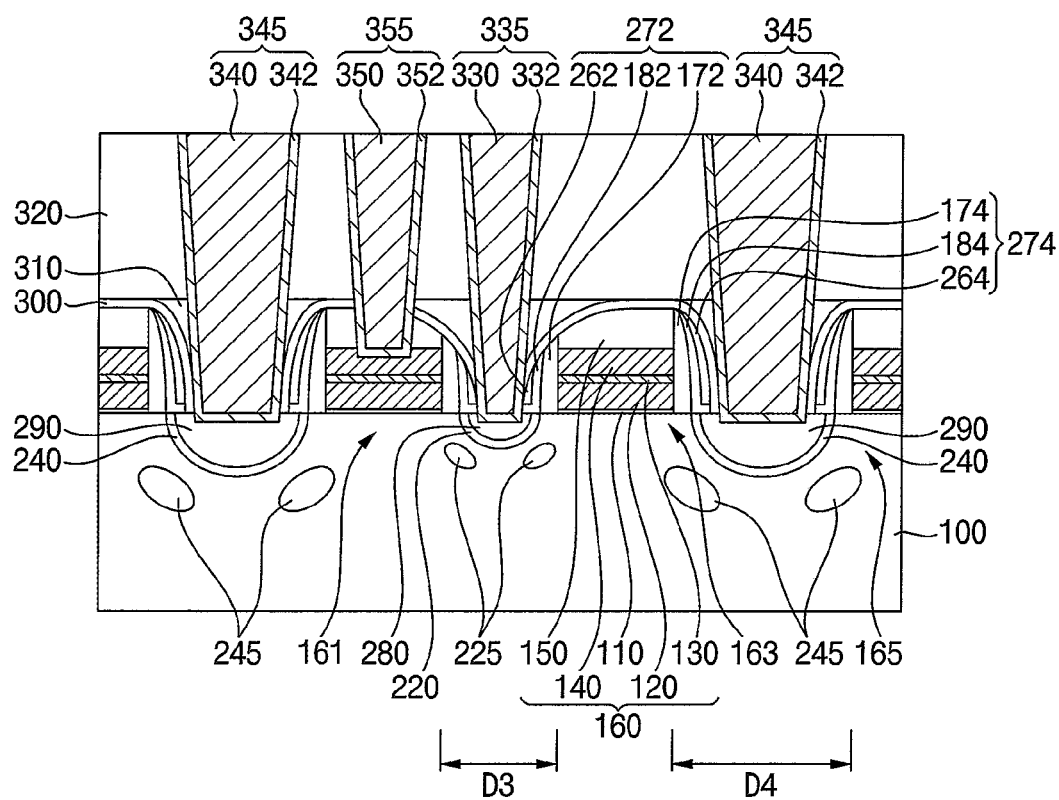

Referring to FIG. 9, a protection layer 300 may be conformally formed on the substrate 100 having the gate structures 160 and the first and second spacers 272 and 274, and a first insulating interlayer 310 may be formed on the protection layer 300.

The protection layer 300 may include a nitride, e.g., silicon nitride, and the first insulating interlayer 310 may include silicon oxide, e.g., tetraethyl orthosilicate (TEOS).

In an example embodiment, a planarization process may be performed on an upper portion of the first insulating interlayer 310, so that an upper surface of the first insulating interlayer 310 may be substantially coplanar with an uppermost surface of the protection layer 300.

A second insulating interlayer 320 may be formed on the first insulating interlayer 310. First and second contact plugs 335 and 345 extending through the first and second insulating interlayers 310 and 320 and the protection layer 300 to physically contact the first and second source/drain layers, respectively, and a third contact plug 355 extending through the second insulating interlayer 320, the protection layer 300 and the gate mask 150 to physically contact the second conductive pattern 140 may be formed to complete the fabrication of the semiconductor device.

The first contact plug 335 may include a first metal pattern 330 and a first barrier pattern 332 at least partially covering a lower surface and a sidewall of the first metal pattern 330, the second contact plug 345 may include a second metal pattern 340 and a second barrier pattern 342 at least partially covering a lower surface and a sidewall of the second metal pattern 340, and a third contact plug 355 may include a third metal pattern 350 and a third barrier pattern 352 at least partially covering a lower surface and a sidewall of the third metal pattern 350.

Each of the first to third metal patterns 330, 340 and 350 may include, e.g., tungsten, copper, aluminum, titanium, tantalum, cobalt, and/or molybdenum, etc., and each of the first to third barrier patterns 332, 342 and 352 may include a metal nitride, e.g., titanium nitride, tantalum nitride, and/or tungsten nitride, etc.

To form the first and second impurity regions 220 and 225 between the first and second structures that are spaced apart from each other at the relatively small first distance D1 by the first and second ion implantation processes, respectively, the first photoresist layer may be patterned to form the first photoresist pattern 210 serving as an ion implantation mask by an exposure process using, e.g., KrF laser equipment and a developing process. However, the third opening 215 may not have a sufficiently small size in the first photoresist pattern 210 due to the resolution limit of the KrF laser equipment, and thus the ArF laser equipment having an enhanced resolution may be used.

However, if the first photoresist pattern 120 is formed by performing an exposure process on a photoresist layer using the ArF laser equipment, diffused reflection may occur due to the underlying structures. That is, the first structures are spaced apart from each other by the small first distance D1 under the first photoresist layer, and thus the first photoresist pattern 210 may not be formed to include the third opening 215 having the desired size due to the diffused reflection by the first structures.

Accordingly, in embodiments of the inventive concept, not the first photoresist pattern 210 alone, but the first and second masks 195 and 205 sequentially stacked may serve as the ion implantation mask. That is, the first photoresist layer may be formed on the first and second mask layers 190 and 200, and the exposure process using the ArF laser equipment and the developing process may be performed to form the first photoresist pattern 210 including the third opening 215 having a generally small size. The first structures spaced apart from each other by a small distance are not directly formed under the first photoresist pattern 210, but the first and second mask layers 190 and 200 having the flat upper surfaces are formed on the first structures, so that the first photoresist pattern 210 including the third opening 215 having the desired size may be formed with no diffused reflection.

The first and second mask layers 190 and 200 may be patterned using the first photoresist pattern 210 as an etching mask to form the first and second masks 195 and 205, and the first and second ion implantation processes may be performed using the first and second masks 195 and 205 to form the first and second impurity regions 220 and 225 having desired sizes at desired locations.

Particularly, the etch stop layer 180 may be further formed on the upper surface of the substrate 100 between the first structures, and may not be removed but remain even when the first and second mask layers 190 and 200 are etched to form the first and second masks 195 and 205, so that the upper surface of the substrate 100 may be protected during the first and second ion implantation processes.

The first and second structures or the first and third structures are spaced apart from each other by the relatively large distance D2, and thus the second photoresist pattern 230 alone may serve as the ion implantation mask when the third and fourth impurity regions 240 and 245 are formed at the portions of the substrate 100 therebetwen by the third and fourth ion implantation processes. That is, when the second photoresist layer is patterned by an exposure process and a developing process to form the second photoresist pattern 230, the KrF laser equipment having a relatively low resolution may be used. In other embodiments, the ArF laser equipment having a relatively high resolution and being sensitive to diffused reflection may be also used, and in this case, the first and second structures or the first and third structures are spaced apart from each other by the large second distance D2, so that the influence of the diffused reflection by the underlying structures on the exposure process may be little.

The semiconductor device manufactured by the above processes may have numerous structural characteristics, which will be described with reference to FIG. 9.

The semiconductor device may include the gate structure 160, the first and second spacer structures 272 and 274 on first and second sidewalls of the gate structure 160 facing each other, and first and second source/drain layers at upper portions of the substrate 100 adjacent to the first and second sidewalls of the gate structure 160, and an upper surface of the gate structure 160 may have a height gradually decreasing from a central portion of the gate structure 160 to the first sidewall thereof, and may have a height substantially constant from the central portion of the gate structure 160 to the second sidewall thereof as shown in the cross-sectional view of FIG. 9.

In example embodiments, the gate structure 160 may include the gate insulation pattern 110, the first conductive pattern 120, the diffusion barrier 130, the second conductive pattern 140 and the gate mask 150 sequentially stacked on the substrate 100.

In example embodiments, an upper surface of the gate mask 150 may have a height gradually decreasing from a central portion of the gate mask 150 to the first sidewall of the gate structure 160, and may have a height substantially constant from the central portion of the gate mask 150 to the second sidewall of the gate structure 160. An upper surface of the second conductive pattern 140 may be substantially constant between the first and second sidewalls of the gate structure 160 as shown in the cross-sectional view of FIG. 9.

In example embodiments, an uppermost surface of the first spacer structure 272 may be lower than an uppermost surface of the second spacer structure 274 in the cross-sectional view of FIG. 9.

In example embodiments, an upper surface of the first spacer structure 272 may gradually decrease as a distance in a horizontal direction substantially parallel to the upper surface of the substrate 100 from the first sidewall of the gate structure 160 increases in the cross-sectional view of FIG. 9.

In example embodiments, the first spacer structure 272 may include the first spacer 172, the first etch stop pattern 182 and the third spacer 262 sequentially stacked on the first sidewall of the gate structure 160 in the horizontal direction, and the second spacer structure 274 may include the second spacer 174, the second etch stop pattern 184 and the fourth spacer 264 sequentially stacked on the second sidewall of the gate structure 160 in the horizontal direction as shown in the cross-sectional view of FIG. 9.

In example embodiments, each of the first and second etch stop patterns 182 and 184 may have a cross-section in a pattern of an "L" shape.

In example embodiments, the first source/drain layer may include the first impurity region 220 containing impurities having the first concentration and the fifth impurity region 280 containing impurities having the third concentration greater than the first concentration and being in the first impurity region 220, and the second source/drain layer may include the third impurity region 240 containing impurities having the second concentration and the sixth impurity region 290 containing impurities having the fourth concentration greater than the third concentration and being in the third impurity region 240.

Hereinafter, three gate structures 160 among the four gate structures 160 shown in FIG. 9 will be referred to as first, second and third gate structures 161, 163 and 165, respectively.

The first and second spacer structures 272 and 274 may be formed on first and second sidewalls opposite to each other of each of the first to third gate structures 161, 163 and 165. The first sidewalls of the first and second gate structures 161 and 163 may face each other, and the second sidewall of each of the first and second gate structures 161 and 163 may be opposite to the first sidewall thereof. The first sidewalls of the second and third gate structures 163 and 165 may face each other, and the second sidewall of each of the second and third gate structures 161 and 163 may be opposite to the first sidewall thereof. However, the first spacer structure 272 may not be necessarily formed on the first sidewall of the third gate structure 165, and in some embodiments, the second spacer structure 274 may be formed thereon.

The source/drain layers at upper portions of the substrate 100 between the first and second gate structures 161 and 163, between the second and third gate structures 163 and 165, at a side of the first gate structure 161, and at a sidewall of the third gate structure 165 may be referred to as first, second, third and fourth source/drain layers, respectively.

The first and second gate structures 161 and 163 may be spaced apart from each other by a third distance D3, and the second and third gate structures 163 and 165 may be spaced apart from each other by a fourth distance D4 greater than the third distance D3.

In example embodiments, an uppermost surface of the first spacer structure 272 on the first sidewall of the second gate structure 163 facing the first gate structure 161 may be lower than an uppermost surface of the second spacer structure 274 on the second sidewall of the second gate structure 163 in the cross-sectional view of FIG. 9.

In example embodiments, an upper surface of the second gate structure 163 may have a height gradually decrease from a central portion of the second gate structure 163 to the first sidewall thereof, and may have a height substantially constant from the central portion of the second gate structure 163 to the second sidewall thereof in the cross-sectional view of FIG. 9.

In example embodiments, an uppermost surface of the first spacer structure 272 on the first sidewall of the first gate structure 161 facing the second gate structure 163 may be lower than an uppermost surface of the second spacer structure 274 on the second sidewall of the first gate structure 161 in the cross-sectional view of FIG. 9.

In example embodiments, an upper surface of the first gate structure 161 may have a height gradually decrease from a central portion of the first gate structure 161 to the first sidewall thereof, and may have a height substantially constant from the central portion of the first gate structure 161 to the second sidewall thereof in the cross-sectional view of FIG. 9.

In example embodiments, the first spacer structure 272 on the first sidewall of the first gate structure 161 facing the second gate structure 163 may be symmetrical with the first spacer structure 272 on the first sidewall of the second gate structure 163.

In example embodiments, the second spacer structure 274 on the second sidewall of the third gate structure 165 facing the second gate structure 163 may be symmetrical with the second spacer structure 274 on the second sidewall of the second gate structure 163.

FIGS. 10 to 27 are plan views and cross-sectional views illustrating a method of manufacturing a semiconductor device according to example embodiments of the inventive concept. Specifically, FIGS. 10, 12, 14, 17, 21 and 26 are the plan views, and each of FIGS. 11, 13, 15-16, 18-20, 22-25 and 27 includes cross-sections taken along lines A-A', B-B' and C-C' of a corresponding plan view.

Hereinafter, in the specification (and not necessarily in the claims), two directions substantially parallel to an upper surface of a substrate 400 and substantially perpendicular to each other may be referred to as first and second directions, respectively, and a direction substantially parallel to the upper surface of the substrate 400 and having an acute angle with respect to the first and second directions may be referred to as a third direction.

This method is application of the method embodiments of manufacturing the semiconductor device illustrated with reference to FIGS. 1 to 10 to embodiments of a method of manufacturing a dynamic random access memory (DRAM) device, and repeated descriptions on the method of manufacturing the semiconductor device are omitted herein.

Figure 10:
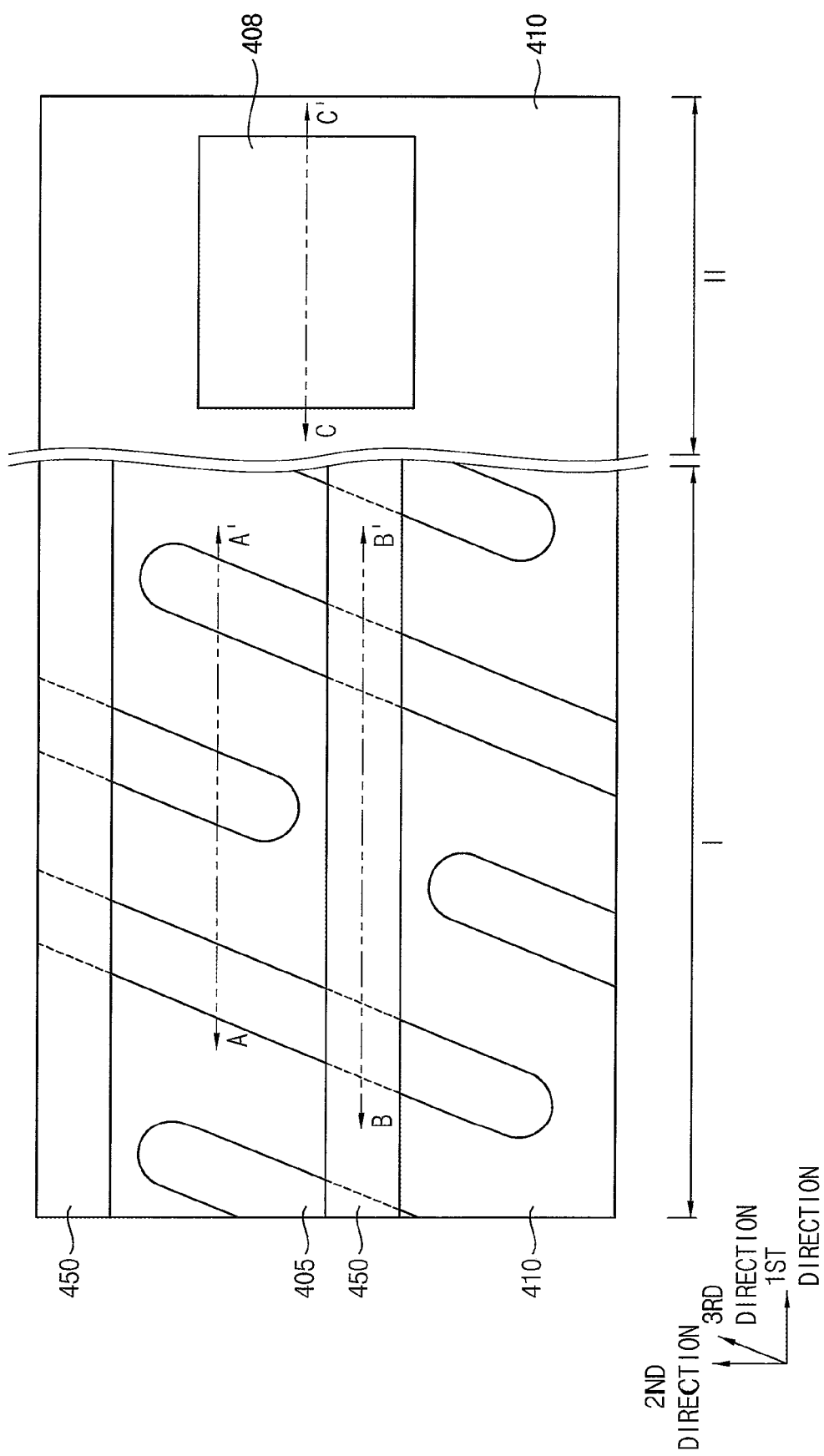
FIGS. 10 to 27 are plan views and cross-sectional views illustrating a method of manufacturing a semiconductor device according to example embodiments of the inventive concept.
Figure 11:
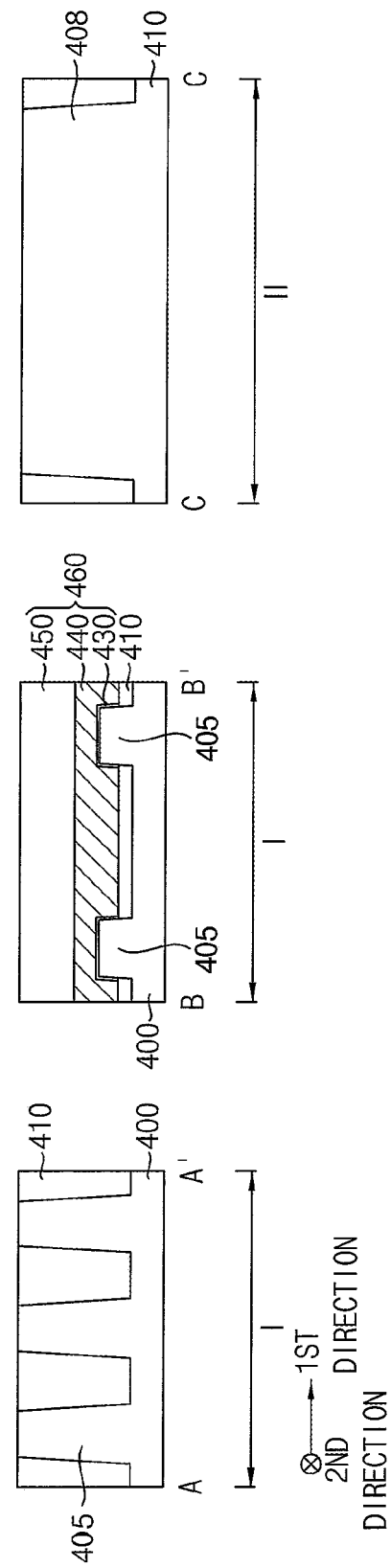

Referring to FIGS. 10 and 11, first and second active patterns 405 and 408 may be formed on the substrate 400 including first and second regions I and II, and an isolation pattern 410 may be formed to at least partially cover sidewalls of the first and second active patterns 405 and 408, respectively.

The first region I of the substrate 400 may be a cell region on which memory cells are formed, and the second region II of the substrate 400 may be a peripheral circuit region on which peripheral circuit patterns for driving the memory cells are formed.

The first and second active patterns 405 and 408 may be formed by removing an upper portion of the substrate 400 to form a first recess. The first active pattern 405 may extend in the third direction, and a plurality of first active patterns 405 may be spaced apart from each other in each of the first and second directions. Additionally, a plurality of second active patterns 408 may be spaced apart from each other in each of the first and second directions, however, FIG. 10 shows only one second active pattern 408.

The isolation pattern 410 may be formed by forming an isolation layer on the substrate 400 to fill the first recess, and planarizing the isolation layer until upper surfaces of the first and second active patterns 405 and 408 are exposed. In example embodiments, the planarization process may include a chemical mechanical polishing (CMP) process and/or an etch back process.

The first active pattern 405 and the isolation pattern 410 on the first region I of the substrate 400 may be partially removed to form a second recess extending in the first direction.

A fourth gate structure 460 may be formed in the second recess. The fourth gate structure 460 may include a first gate insulation layer 430 on a surface of the first active pattern 405 exposed by the second recess, a gate electrode 440 on the first gate insulation layer 430 to at least partially fill a lower portion of the second recess, and a first gate mask 450 on the gate electrode 440 to at least partially fill an upper portion of the second recess. The fourth gate structure 460 may extend in the first direction on the first region I of the substrate 400, and a plurality of fourth gate structures 460 may be spaced apart from each other in the second direction.

The first gate insulation layer 430 may be formed by performing a thermal oxidation process on the surface of the first active pattern 405 exposed by the second recess, and thus may include, for example, silicon oxide. The gate electrode 440 may include a metal, a metal nitride, a metal silicide, doped polysilicon, etc., and the first gate mask 450 may include a nitride, e.g., silicon nitride.

Figure 12:
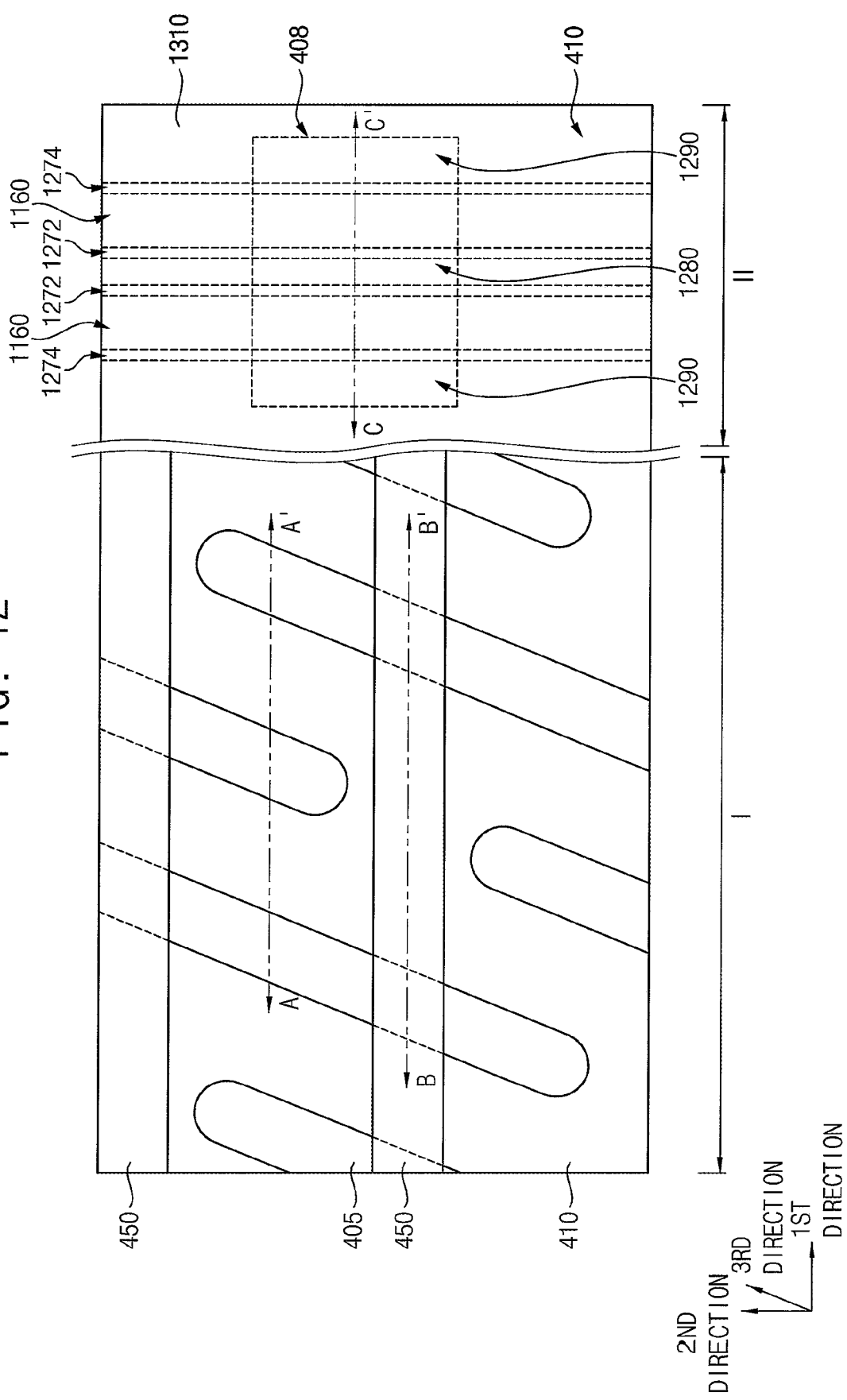
Figure 13:
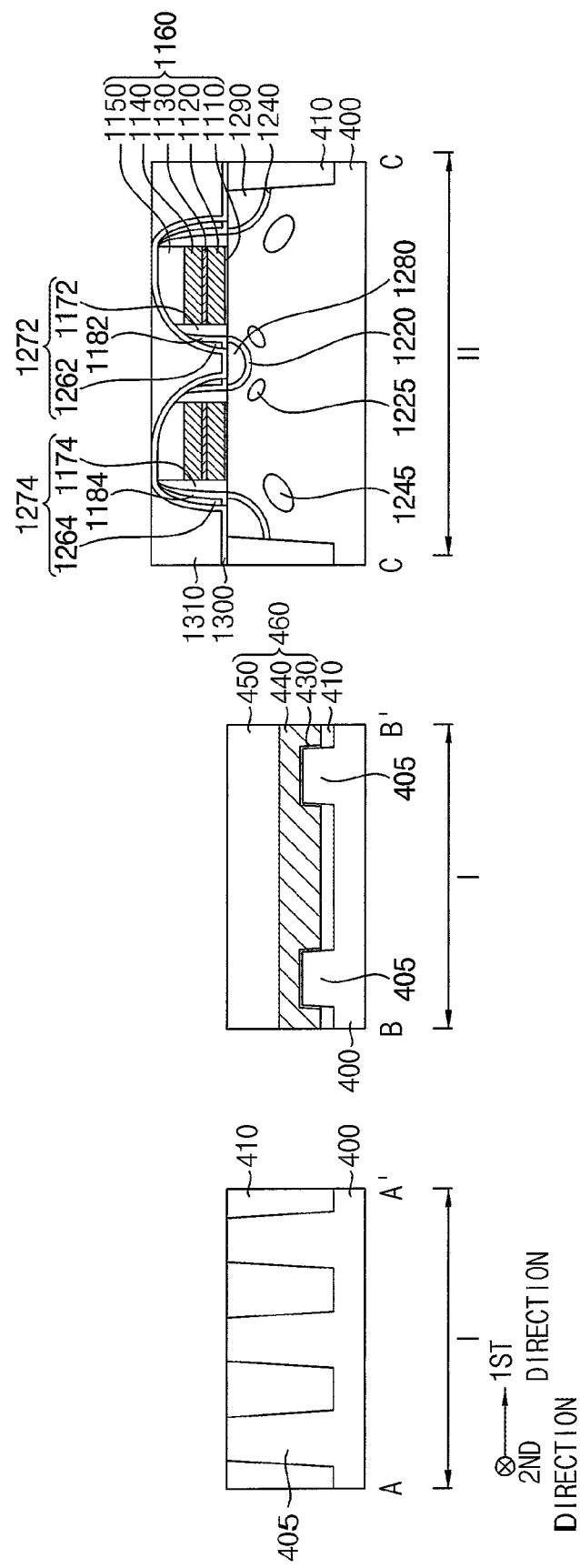

Referring to FIGS. 12 and 13, processes substantially the same as or similar to those illustrated with reference to FIGS. 1 to 8 may be performed to form a fifth gate structure 1160, first and second spacer structures 1272 and 1274, and first to sixth impurity regions 1220, 1225, 1240, 1245, 1280 and 1290 on the second region II of the substrate 400. Additionally, processes substantially the same as or similar to those illustrated with reference to FIG. 9 may be performed to form a protection layer 1300 and a first insulating interlayer 1310.

FIG. 12 shows only the fifth gate structures 1160 corresponding to the two gate structures 160 among the four gate structures 160 shown in FIG. 9, that is, the first and second gate structures 161 and 163, however, embodiments of the inventive concept may not be limited thereto.

Each of the fifth gate structures 1160 may include a second gate insulation pattern 1110, a first conductive pattern 1120, a diffusion barrier 1130, a second conductive pattern 1140 and a second gate mask 1150 sequentially stacked. The first spacer structure 1272 may include a first spacer 1172, a first etch stop pattern 1182, and a third spacer 1262 sequentially stacked in a horizontal direction substantially parallel to an upper surface of the substrate 400, and the second spacer structure 1274 may include a second spacer 1174, a second etch stop pattern 1184 and a fourth spacer 1264 sequentially stacked in the horizontal direction.

The first and fifth impurity regions 1220 and 1280 may be formed at an upper portion between the fifth gate structures 1160 to serve as a first source/drain layer, and the second impurity region 1225 may be formed under the first source/drain layer to serve as a halo region. Additionally, the third and sixth impurity regions 1240 and 1290 may be formed at an upper portion of the substrate 400 at one side in the first direction of each of the fifth gate structures 1160 to serve as a second source/drain layer, and the fourth impurity region 1245 may be formed under the second source/drain layer.

The protection layer 1300 may be formed on the second region II of the substrate 400 to at least partially cover the fifth gate structures 1160 and the first and second spacer structures 1272 and 1274, and the first insulating interlayer 1310 may be formed on the protection layer 1300 and may have a generally flat upper surface.

Figure 14:
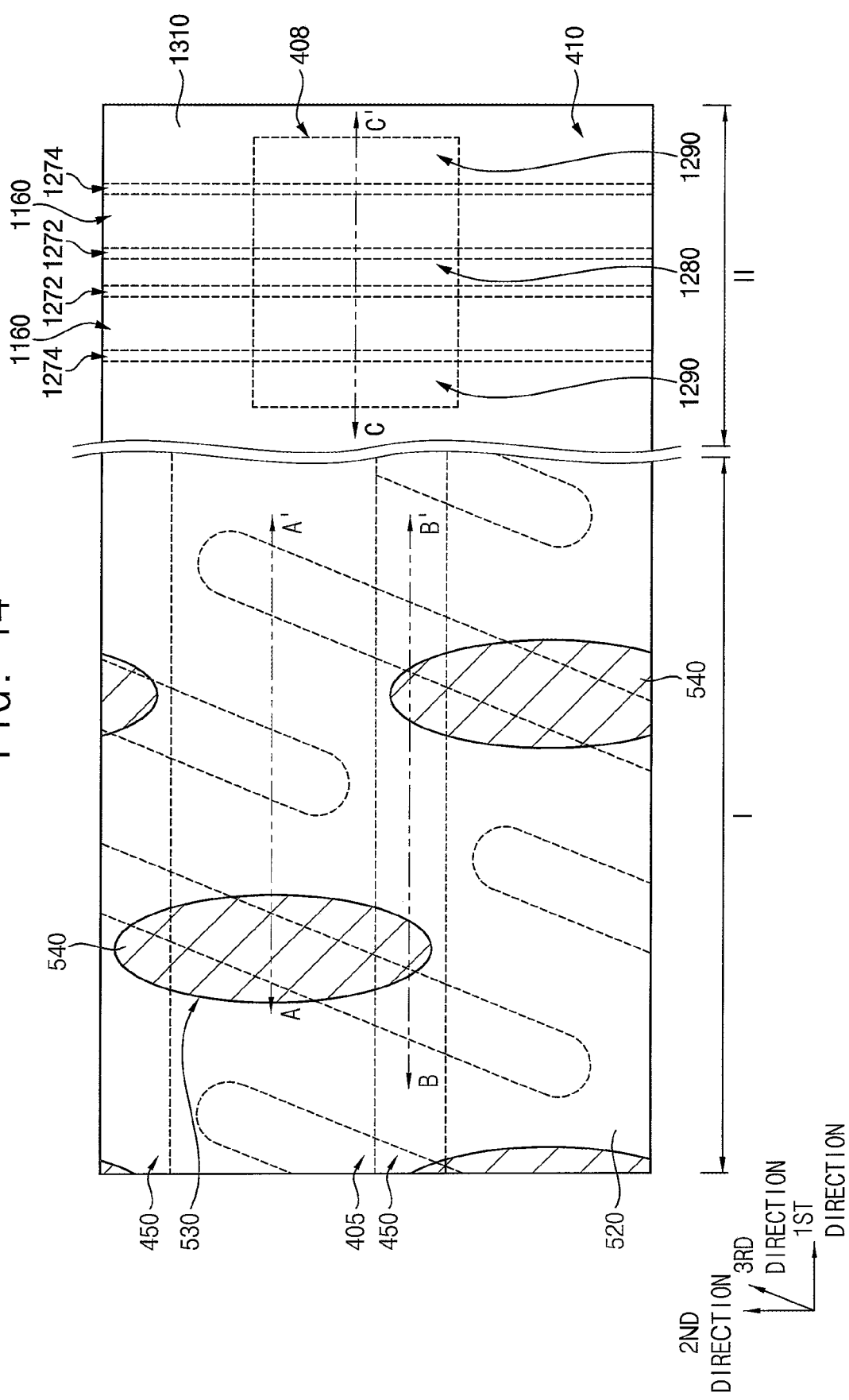
Figure 15:
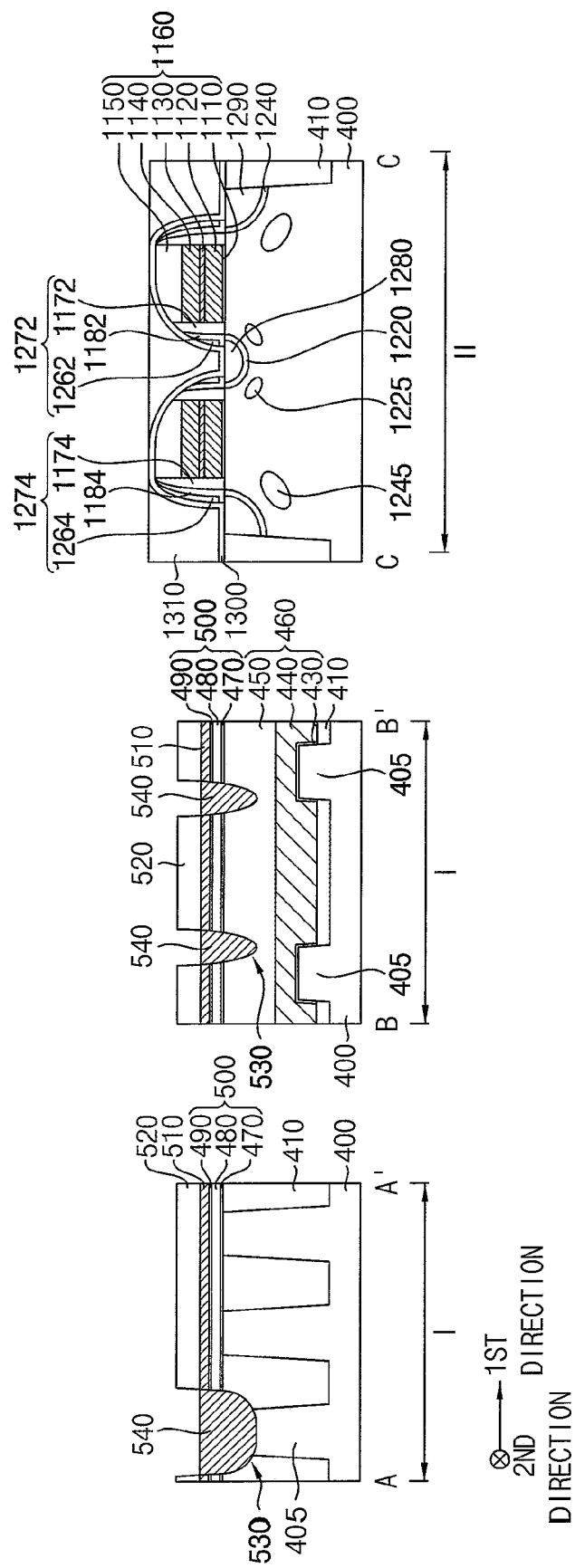

Referring to FIGS. 14 and 15, an insulation layer structure 500 may be formed on the first active pattern 405, the isolation pattern 410 and the fourth gate structure 460 on the first region I of the substrate 400 and the first insulating interlayer 1310 on the second region II of the substrate 400, a third conductive layer 510 and a third mask 520 may be sequentially formed on the insulation layer structure 500, and the third conductive layer 510 and the insulation layer structure 500 may be etched using the third mask 520 as an etching mask to form a fifth opening 530 exposing the first active pattern 405.

The third mask 520 may be formed only on the first region I of the substrate 400, and thus portions of the third conductive layer 510 and the insulation layer structure 500 on the second region II of the substrate 400 may be removed.

During the etching process, upper portions of the first active pattern 405 and the isolation pattern 410 adjacent thereto exposed by the fifth opening 530, and an upper portion of the first gate mask 450 may be also etched to form a third recess. That is, a bottom of the fifth opening 530 may be referred to as a third recess.

In example embodiments, the insulation layer structure 500 may include first, second, and third insulation layers 470, 480, and 490 sequentially stacked. The first and third insulation layers 470 and 490 may include an oxide, e.g., silicon oxide, and the second insulation layer 480 may include a nitride, e.g., silicon nitride. The third conductive layer 510 may include, for example, polysilicon doped with impurities, and the third mask 520 may include a nitride, e.g., silicon nitride.

In example embodiments, the fifth opening 530 may expose an upper surface of a central portion of each of the first active patterns 405 extending in the third direction, and thus a plurality of fifth openings 530 may be formed in each of the first and second directions.

A fourth conductive layer 540 may be formed to at least partially fill the fifth opening 530.

In example embodiments, the fourth conductive layer 540 may be formed by forming a preliminary fourth conductive layer on the first active pattern 405, the isolation pattern 410, the first gate mask 450, the third mask 520 and the first insulating interlayer 1310 to at least partially fill the fifth opening 530, and removing an upper portion of the preliminary fourth conductive layer through a CMP process and/or an etch bask process. Thus, the fourth conductive layer 540 may have an upper surface substantially coplanar with an upper surface of the third conductive layer 510 in the cross-sectional view of FIG. 15.

In example embodiments, a plurality of fourth conductive layers 540 may be spaced apart from each other in each of the first and second directions. The fourth conductive layer 540 may include, for example, doped polysilicon, and may be merged to the third conductive layer 510 to form a monolithic layer.

Figure 16:
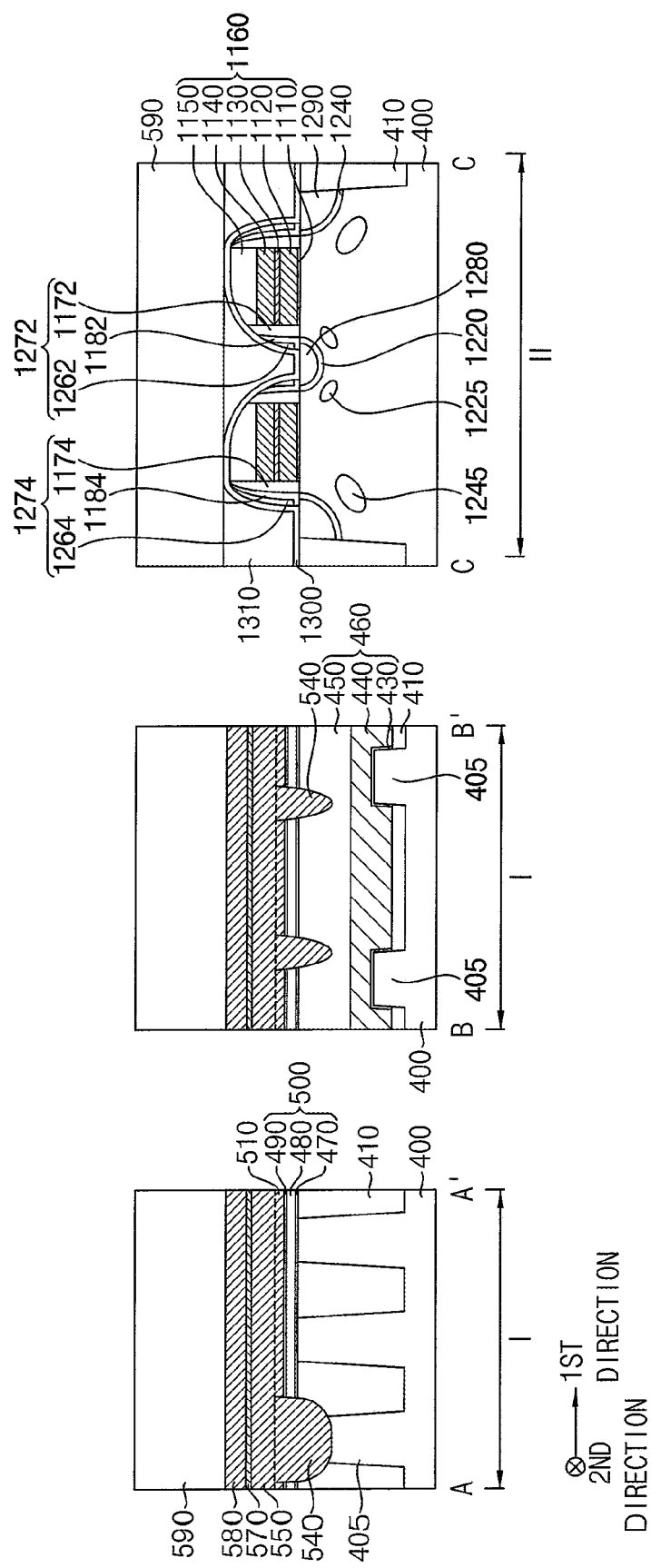

Referring to FIG. 16, after removing the third mask 520, a fifth conductive layer 550, a diffusion barrier layer 570, a sixth conductive layer 580 may be sequentially formed on the third and fourth conductive layers 510 and 540 on the first region I of the substrate 400.

In example embodiments, the fifth conductive layer 550 may include a material substantially the same as that of the third and fourth conductive layers 510 and 540. That is, the fifth conductive layer 550 may include doped polysilicon, and thus, in some embodiments, may be merged with the third and fourth conductive layers 510 and 540 to form a monolithic layer.

The diffusion barrier layer 570 may include a metal silicon nitride, e.g., titanium silicon nitride, and the sixth conductive layer 580 may include a metal, e.g., tungsten.

A capping layer 590 may be formed on the sixth conductive layer 580 and the first insulating interlayer 1310 on the first and second regions I and II of the substrate 400. The capping layer 590 may include a nitride, e.g., silicon nitride.

Figure 17:
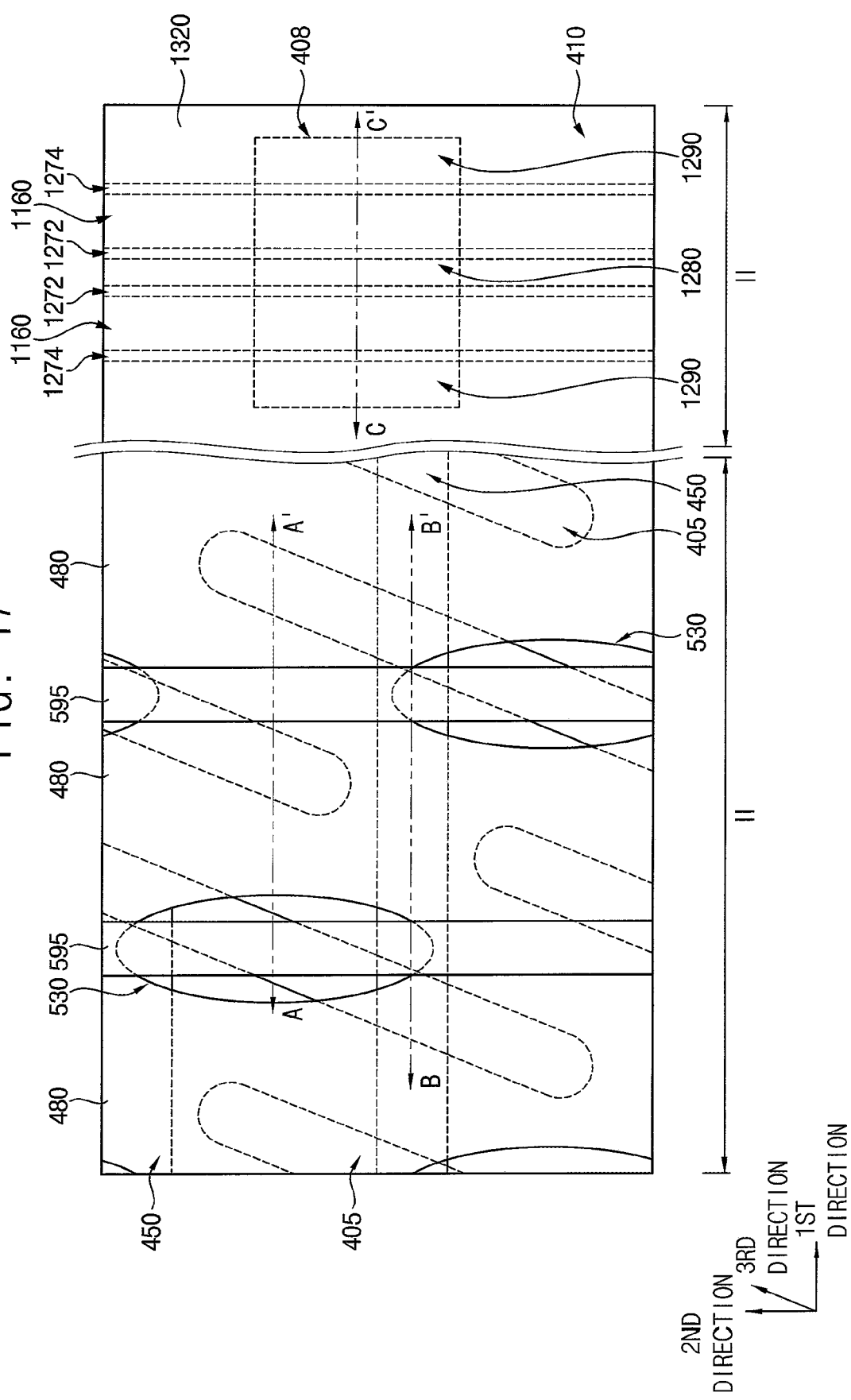
Figure 18:
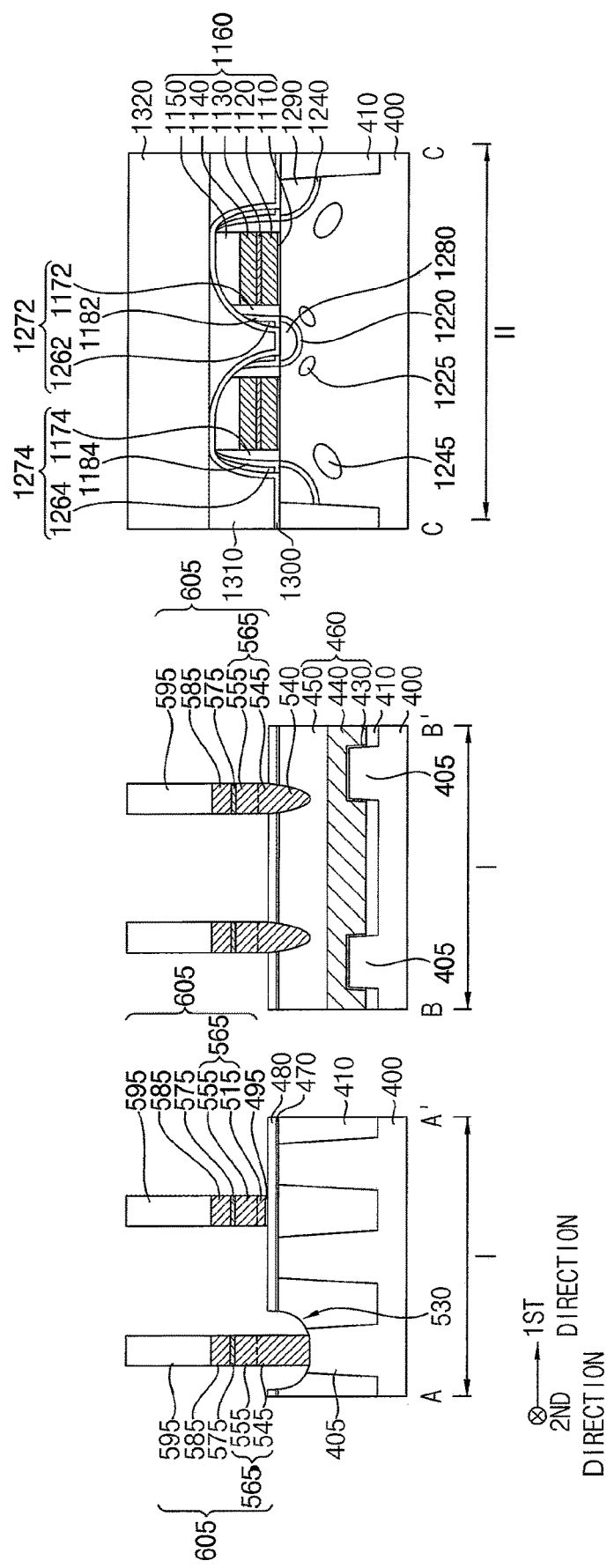

Referring to FIGS. 17 and 18, a portion of the capping layer 590 on the first region I of the substrate 400 may be patterned to form a first capping pattern 595, and the sixth conductive layer 580, the diffusion barrier layer 570, the fifth conductive layer 550, the third and fourth conductive layers 510 and 540 and the third insulation layer 490 may be sequentially etched using the first capping pattern 595 as an etching mask.

In example embodiments, the first capping pattern 595 may extend in the second direction on the first region I of the substrate 400, and a plurality of first capping patterns 595 may be formed to be spaced apart from each other in the first direction. The capping layer 590 may remain on the second region II of the substrate 400 as a second insulating interlayer 1320.

By the etching process, on the first region I of the substrate 400, a fourth conductive pattern 545, a fifth conductive pattern 555, a first diffusion barrier pattern 575, a sixth conductive pattern 585 and the first capping pattern 595 may be sequentially stacked on the first active pattern 505, the isolation pattern 410 and the first gate mask 450 in the fifth opening 530, and a third insulation pattern 495, a third conductive pattern 515, the fifth conductive pattern 555, the first diffusion barrier pattern 575, the sixth conductive pattern 585, and the first capping pattern 595 may be sequentially stacked on the second insulation layer 480 of the insulation layer structure 500 at an outside of the fifth opening 530.

As illustrated above, the third to fifth conductive layers 510, 540 and 550 may be merged with each other, and thus the fourth and fifth conductive patterns 545 and 555 sequentially stacked and the third and fifth conductive patterns 515 and 555 sequentially stacked may each form one conductive structure 565. Hereinafter, the conductive structure 565, the first diffusion barrier pattern 575, the sixth conductive pattern 585, and the first capping pattern 595 sequentially stacked may be referred to as a bit line structure 605.

In example embodiments, the bit line structure 605 may extend in the second direction on the first region I of the substrate 400, and a plurality of bit line structures 605 may be spaced apart from each other in the first direction.

Figure 19:
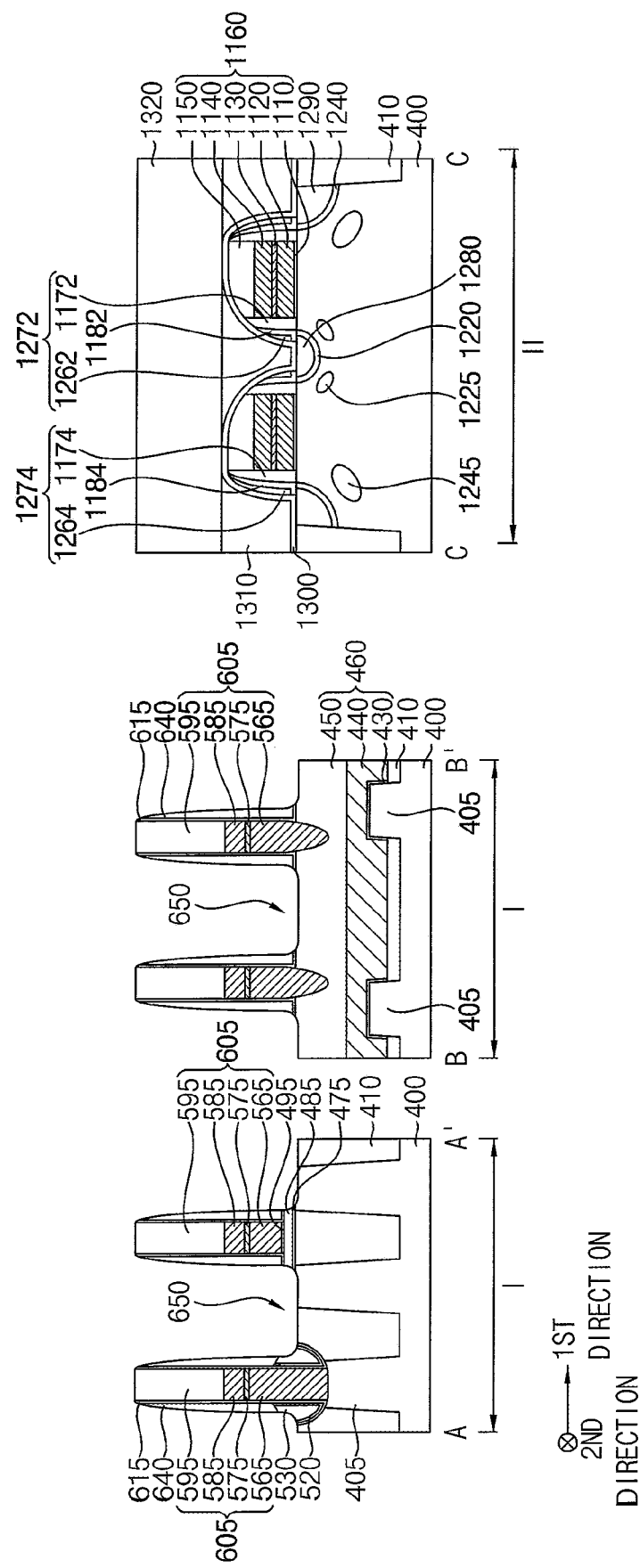

Referring to FIG. 19, a fifth spacer layer may be formed on upper surfaces of the first active pattern 505, the isolation pattern 410 and the first gate mask 450 exposed by the fifth opening 530, a sidewall of the fifth opening 530, the second insulation layer 480, and the second insulating interlayer 1320 to at least partially cover the bit line structure 605, and fourth and fifth insulation layers may be sequentially formed on the fifth spacer layer.

The fifth spacer layer may also at least partially cover a sidewall of the third insulation pattern 495 between the second insulation layer 480 and the bit line structure 605, and the fifth insulation layer may at least partially fill the fifth opening 530.

The fifth spacer layer may include a nitride, e.g., silicon nitride, the fourth insulation layer may include an oxide, e.g., silicon oxide, and the fifth insulation layer may include a nitride, e.g., silicon nitride.

The fourth and fifth insulation layers may be etched by an etching process. In example embodiments, the etching process may be performed by a wet etch process using an etching solution including phosphorous acid ($H_3PO_4$), SC1, hydrogen fluoride (HF), and other portions of the fourth and fifth insulation layers except for a portion in the fifth opening 530 may be removed. Thus, most of an entire surface of the fifth spacer layer, that is, an entire surface except for a portion thereof in the fifth opening 530 may be exposed, and portions of the fourth and fifth insulation layers remaining in the fifth opening 530 may form fourth and fifth insulation patterns 620 and 630, respectively.

A sixth spacer layer may be formed on the exposed surface of the fifth spacer layer and the fourth and fifth insulation patterns 620 and 630 in the fifth opening 530, and may be anisotropically etched to form a sixth spacer 640 on the surface of the fifth spacer layer and the fourth and fifth insulation patterns 620 and 630 to at least partially cover a sidewall of the bit line structure 605. The sixth spacer layer may include an oxide, e.g., silicon oxide.

A dry etching process may be performed using the first capping pattern 595 and the sixth spacer 640 as an etching mask to form a sixth opening 650 exposing the upper surface of the first active pattern 405. The upper surface of the isolation pattern 410 and the upper surface of the first gate mask 450 may be also exposed by the sixth opening 650.

By the dry etching process, portions of the fifth spacer layer on upper surfaces of the first capping pattern 595, the second insulation layer 480, and the second insulating interlayer 1320 may be removed, and thus a fifth spacer 615 at least partially covering the sidewall of the bit line structure 605 may be formed. Additionally, during the dry etching process, the first and second insulation layers 470 and 480 may be partially removed, such that first and second insulation patterns 475 and 485 may remain under the bit line structure 605. The first to third insulation patterns 475, 485 and 495 that are sequentially stacked under the bit line structure 605 may form an insulation pattern structure.

Figure 20:
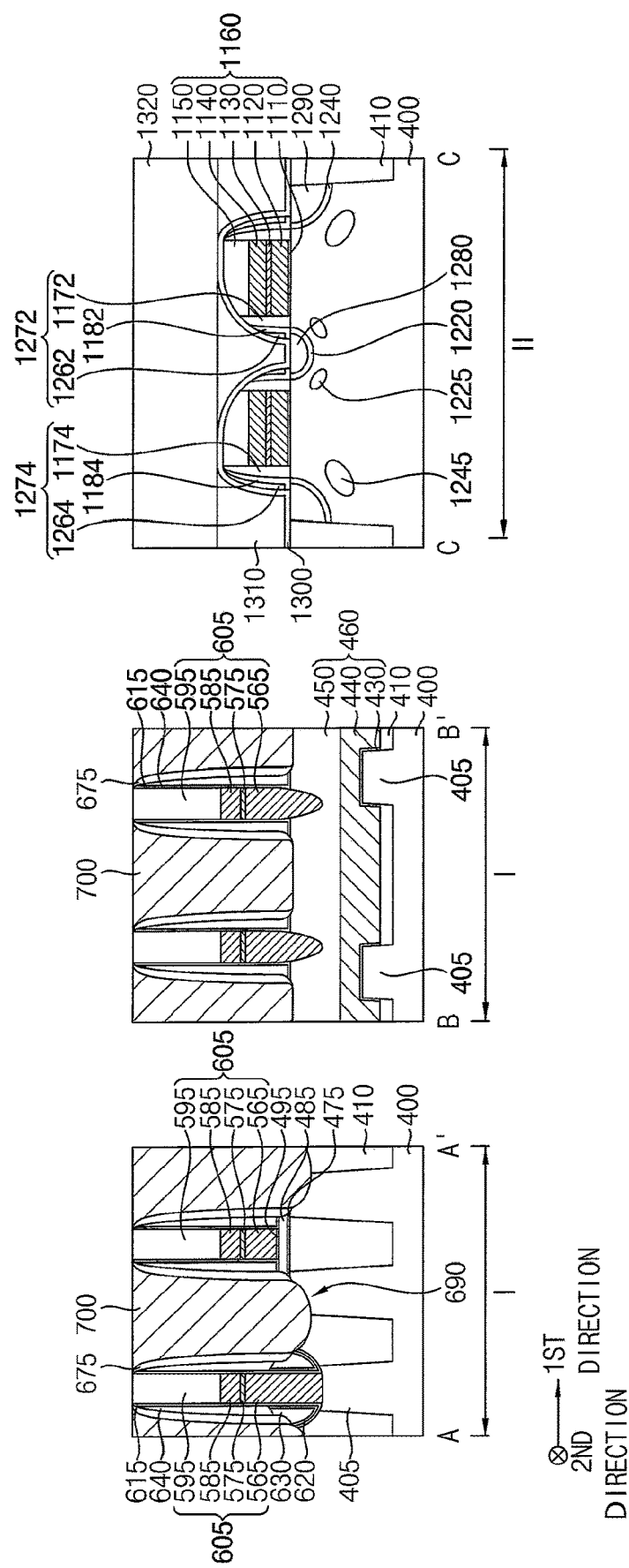

Referring to FIG. 20, a seventh spacer layer may be formed on the upper surface of the first capping pattern 595, the upper surface of the second insulating interlayer 1320, an outer sidewall of the sixth spacer 640, portions of upper surfaces of the fourth and fifth insulation patterns 620 and 630, and the upper surfaces of the first active pattern 405, the isolation pattern 410 and the first gate mask 450 exposed by the sixth opening 650, and may be anisotropically etched to form a seventh spacer 675 at least partially covering the sidewall of the bit line structure 605. The seventh spacer layer may include a nitride, e.g., silicon nitride.

The fifth to seventh spacers 615, 640 and 675 sequentially stacked in the horizontal direction in the cross-sectional views of FIG. 20 from the sidewall of the bit line structure 605 on the first region I of the substrate 400 may be referred to as a preliminary spacer structure.

An upper portion of the first active pattern 405 may be removed by an etching process to form a fourth recess 690 connected to the sixth opening 650.

A lower contact plug layer 700 may be formed to at least partially fill the sixth opening 650 and the fourth recess 690 on the first region I of the substrate 400, and an upper portion of the lower contact plug layer 700 may be planarized until the upper surface of the first capping pattern 595 is exposed.

In example embodiments, the lower contact plug layer 700 may extend in the second direction, and a plurality of lower contact plug layers 700 may be formed to be spaced apart from each other in the first direction by the bit line structures 605. The lower contact plug layer 700 may include, e.g., doped polysilicon.

Figure 21:
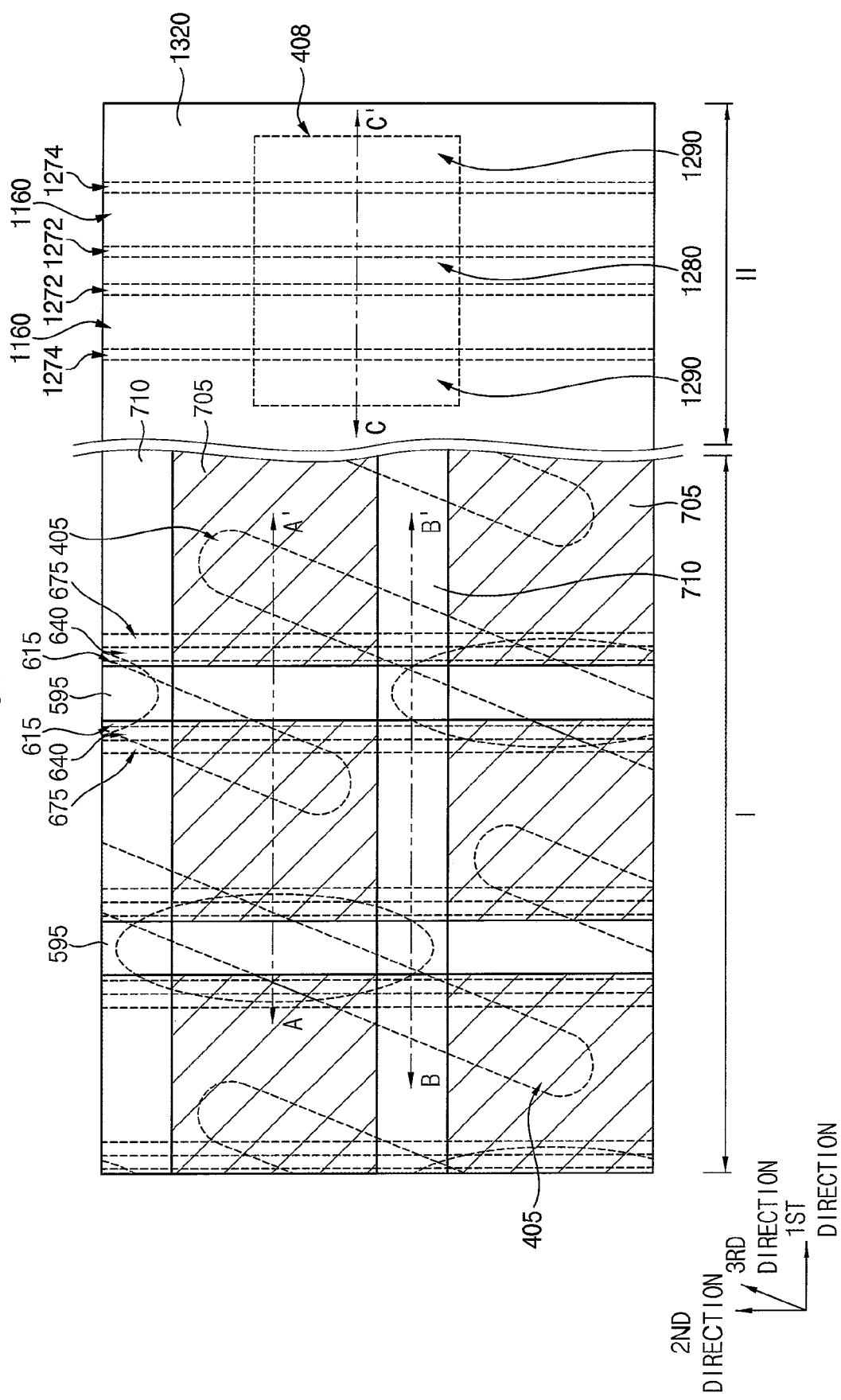
Figure 22:
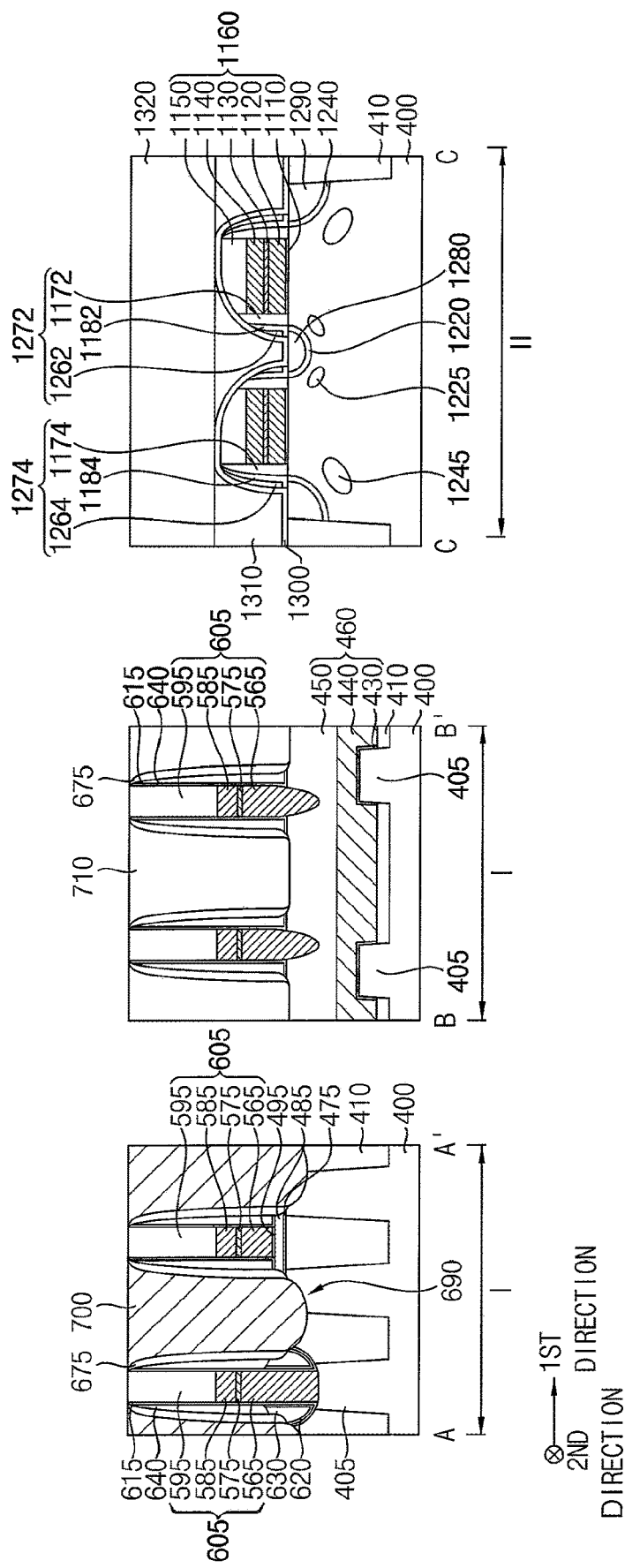

Referring to FIGS. 21 and 22, a fourth mask (not shown) including seventh openings, each of which may extend in the first direction, spaced apart from each other in the second direction may be formed on the first capping pattern 595, the second insulating interlayer 1320, and the lower contact plug layer 700 on the first region I of the substrate 400, and the lower contact plug layer 700 may be etched using the fourth mask as an etching mask.

In example embodiments, each of the seventh openings may overlap the fourth gate structure 460 in a vertical direction substantially perpendicular to the upper surface of the substrate 400. By the etching process, an eighth opening may be formed to expose the upper surface of the first gate mask 450 of the fourth gate structure 460 between the bit line structures 605 on the first region I of the substrate 400.

After removing the fourth mask, a second capping pattern 710 may be formed on the first region I of the substrate 400 to at least partially fill the eighth opening. The second capping pattern 710 may include a nitride, e.g., silicon nitride. In example embodiments, the second capping pattern 710 may extend in the first direction between the bit line structures 605, and a plurality of second capping patterns 710 may be formed in the second direction.

Thus, the lower contact plug layer 700 extending in the second direction between the bit line structures 605 may be divided into a plurality of lower contact plugs 705 spaced apart from each other in the second direction by the second capping patterns 710 on the first region I of the substrate 400.

Figure 23:
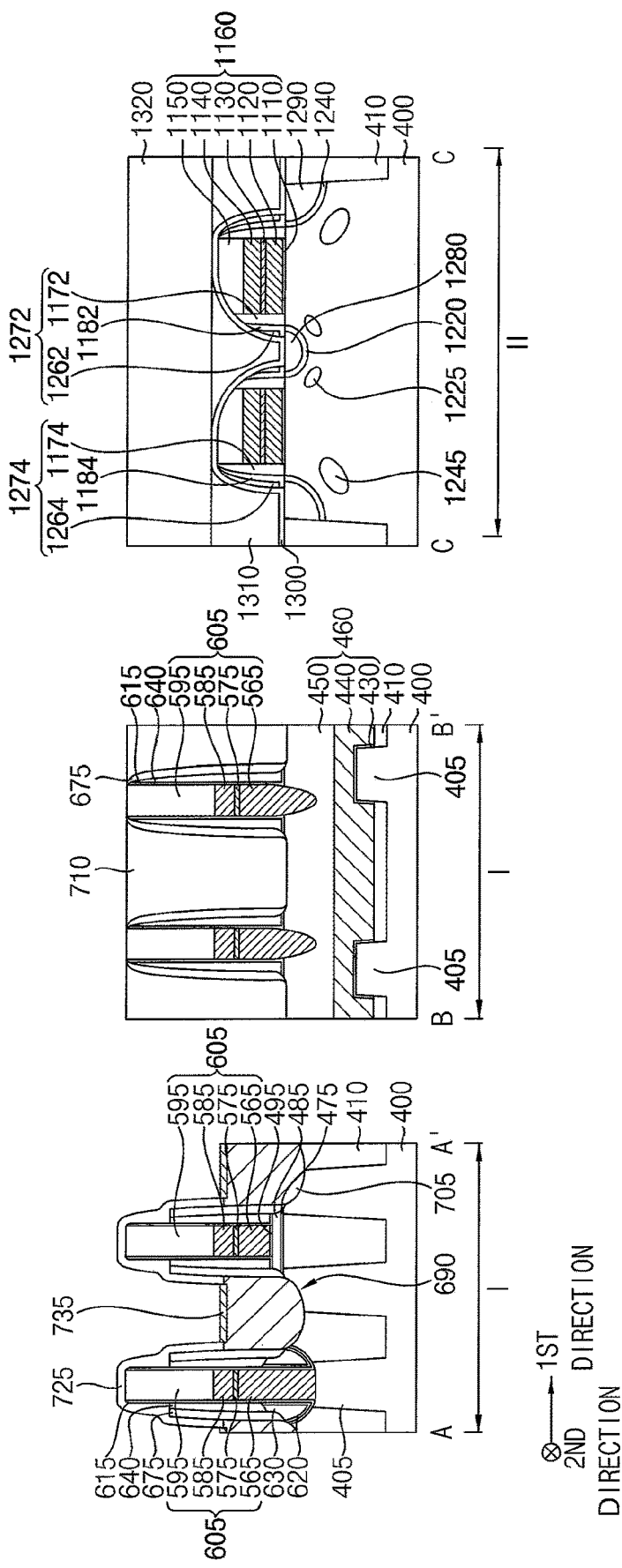

Referring to FIG. 23, an upper portion of the lower contact plug 705 may be removed to expose an upper portion of the preliminary spacer structure on the sidewall of the bit line structure 605, and upper portions of the sixth and seventh spacers 640 and 675 of the exposed preliminary spacer structure may be removed.

An etch back process may be further performed to remove an upper portion of the lower contact plug 705. Thus, the upper surface of the lower contact plug 705 may be lower than uppermost surfaces of the sixth and seventh spacers 640 and 675 in the cross-sectional views of FIG. 23.

An eighth spacer layer may be formed on the bit line structure 605, the preliminary spacer structure, the second capping pattern 710, and the lower contact plug 705, and may be anisotropically etched so that an eighth spacer 725 may be formed to at least partially cover the fifth to seventh spacers 615, 640 and 675 on each of opposite sidewalls of the bit line structure 605 in the first direction and that an upper surface of the lower contact plug 705 may not be covered by the eighth spacer 725 but may be exposed.

A metal silicide pattern 735 may be formed on the exposed upper surface of the lower contact plug 705. In example embodiments, the metal silicide patterns 735 may be formed by forming a metal layer on the first and second capping patterns 595 and 710, the second insulating interlayer 1320, the eighth spacer 725, and the lower contact plug 705, thermally treating the metal layer, and removing an unreacted portion of the metal layer. The metal silicide patterns 735 may include, e.g., cobalt silicide, nickel silicide, and/or titanium silicide, etc.

Figure 24:
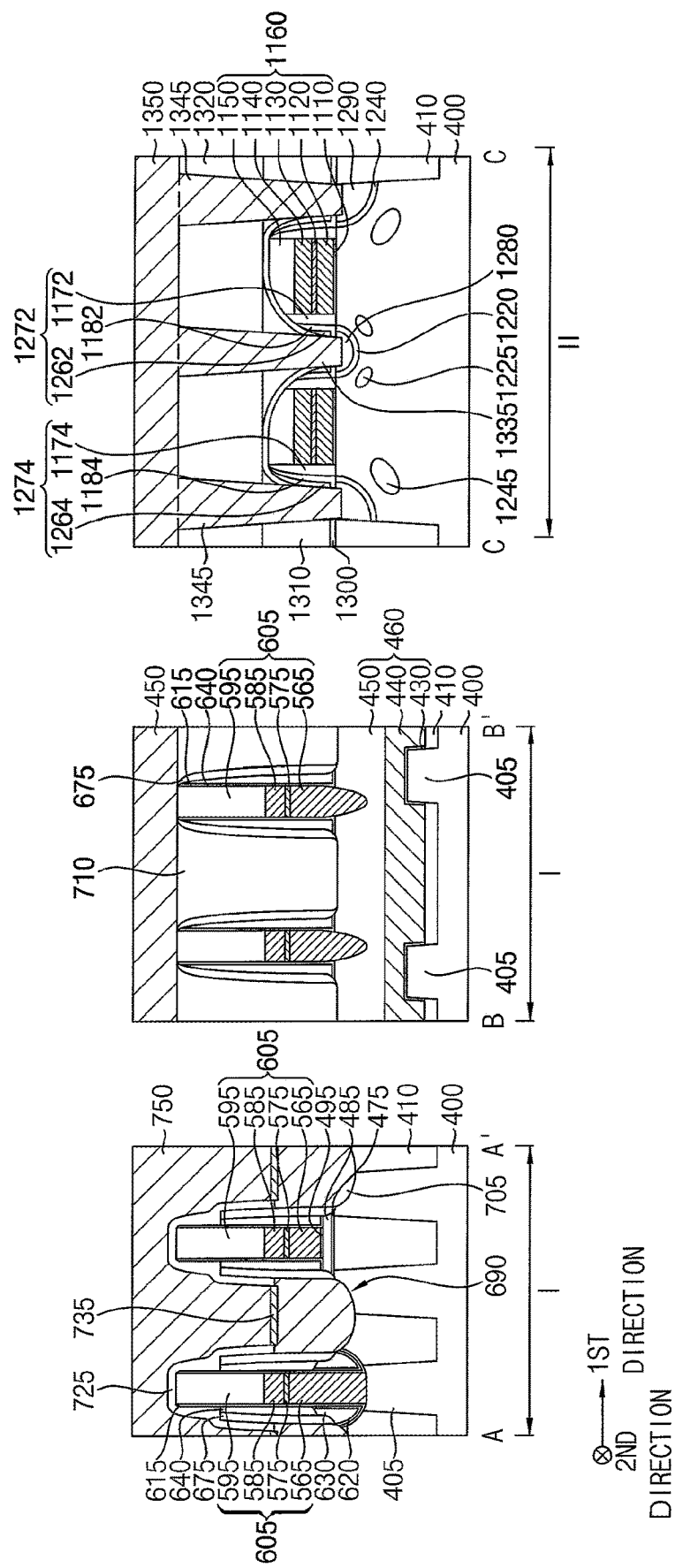

Referring to FIG. 24, a first sacrificial layer may be formed on the first and second capping patterns 595 and 710, the second insulating interlayer 1320, the eighth spacer 725, the metal silicide pattern 735 and the lower contact plug 705, an upper portion of the first sacrificial layer may be planarized until upper surfaces of the first and second capping patterns 595 and 710 and the second insulating interlayer 1320 are exposed, and first and second holes may be formed on the second region II of the substrate 400.

The first sacrificial layer may include, e.g., SOH, and/or ACL, etc.

The first and second holes may extend through the first and second insulating interlayers 1310 and 1320 and the protection layer 1300 to expose upper surfaces of the first and second source/drain layers on the second region II of the substrate 400.

After removing the first sacrificial layer, an upper contact plug layer 750 may be formed on the first and second capping patterns 595 and 710, the fifth to eighth spacers 615, 640, 675 and 725, the metal silicide pattern 735, the lower contact plug 705, and the first and second source/drain layers, and an upper portion of the upper contact plug layer 750 may be planarized. Thus, first and second contact plugs 1335 and 1345 may be formed in the first and second holes, respectively.

The upper contact plug layer 750 may include a metal, e.g., tungsten.

As shown in FIG. 1, each of the first and second contact plugs 1335 and 1345 and the upper contact plug layer 750 may include a metal pattern and a barrier pattern at least partially covering a lower surface and a sidewall thereof. Contact plugs (not shown) may be further formed through the second insulating interlayer 1320, the protection layer 1300 and the second gate mask 1150 to physically contact the second conductive pattern 1140.

In example embodiments, an upper surface of the upper contact plug layer 750 may be higher than the upper surfaces of the first and second capping patterns 595 and 710 and the second insulating interlayer 1320 in the cross-sectional views of FIG. 24.

Figure 25:
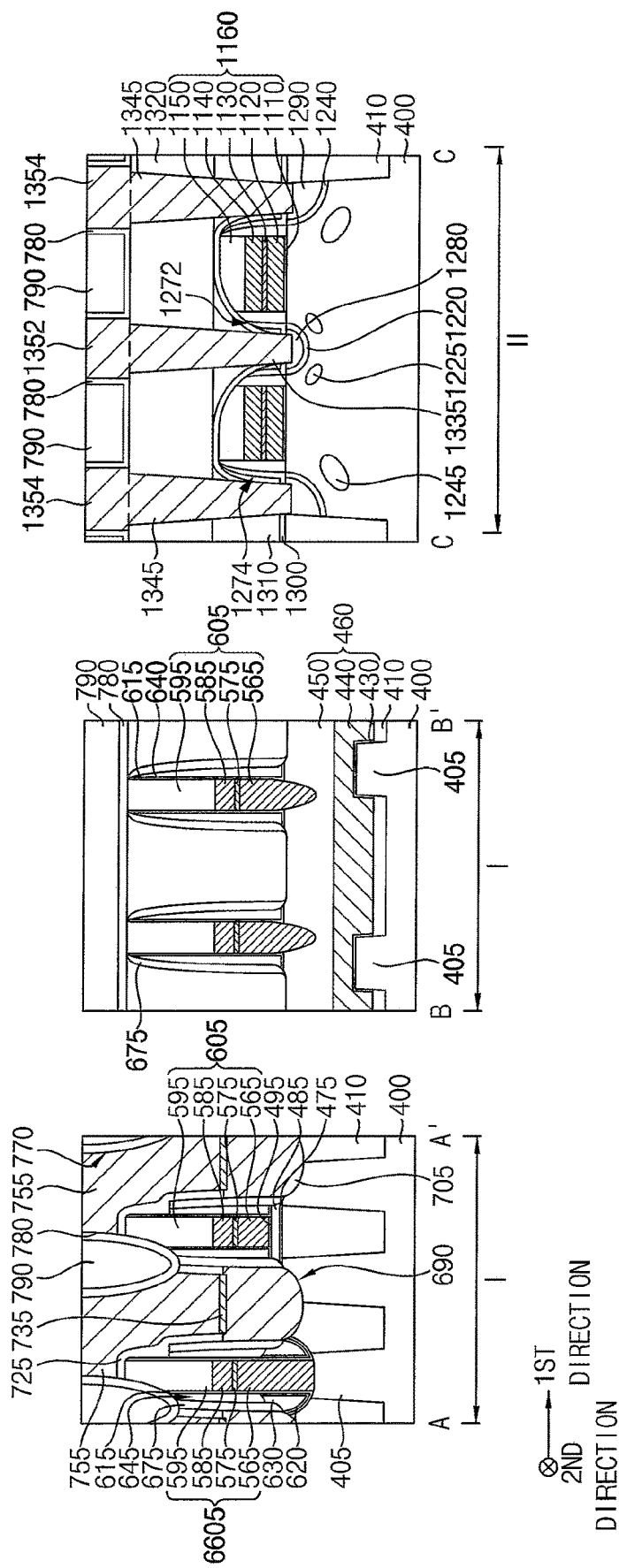

Referring to FIG. 25, a third hole 770 may be formed on the first region I of the substrate 400, and the upper contact plug layer 750 may be patterned on the second region II of the substrate 400.

The third hole 770 may be formed by removing upper portions of the upper contact plug layer 750, the first capping pattern 595, and the fifth, seventh and eighth spacers 615, 675 and 725, and thus the third hole 770 may expose an upper surface of the sixth spacer 640.

As the third hole 770 is formed, the upper contact plug layer 750 on the first region I of the substrate 400 may be transformed into an upper contact plug 755. In example embodiments, a plurality of upper contact plugs 755 may be formed to be spaced apart from each other in each of the first and second directions, and may be arranged in a honeycomb pattern in a plan view. Each of the upper contact plugs 755 may have a shape of, for example, a circle, ellipse, or polygon in a plan view.

The lower contact plug 705, the metal silicide pattern 735 and the upper contact plug 755 sequentially stacked on the first region I of the substrate 400 may form a contact plug structure.

As the upper contact plug layer 750 is patterned on the second region II of the substrate 400, first and second wirings 1352 and 1354 may be formed on the first and second contact plugs 1335 and 1345, respectively, which may be electrically connected to the first and second source/drain layers, respectively.

The exposed sixth spacer 640 may be removed to form an air gap 645 connected to the third hole 770. The sixth spacer 640 may be removed by, e.g., a wet etching process.

In example embodiments, not only a portion of the sixth spacer 640 on the sidewall of the bit line structure 605 extending in the second direction directly exposed by the third hole 770 but also other portions of the sixth spacer 640 parallel to the directly exposed portion thereof in the horizontal direction in the cross-sectional views of FIG. 25 may be removed. That is, not only the portion of the sixth spacer 640 exposed by the third hole 770 not to be covered by the upper contact plug 755 but also a portion of the sixth spacer 640 adjacent to the exposed portion in the second direction to be at least partially covered by the second capping pattern 710 and a portion of the sixth spacer 640 adjacent to the exposed portion in the second direction to be at least partially covered by the upper contact plug 755 may be all removed.

Third and fourth insulating interlayers 780 and 790 may be sequentially stacked to at least partially fill the third hole 770 on the first region I of the substrate 400 and a space between the first and second wirings 1352 and 1354 on the second region II of the substrate 400. The third and fourth insulating interlayers 780 and 790 may be also sequentially stacked on the second capping pattern 710.

The third insulating interlayer 780 may include a material having a low gap filling characteristic, and thus the air gap 645 under the third hole 770 may not be filled. The air gap 645 may be also referred to as an air spacer 645, and may form a third spacer structure together with the fifth, seventh and eighth spacers 615, 675 and 725. That is, the air gap 645 may be a spacer including an air pocket. The fourth insulating interlayer 790 may include an oxide, e.g., silicon oxide, a nitride, e.g., silicon nitride, and/or carbonitride, e.g., silicon carbonitride.

Figure 26:
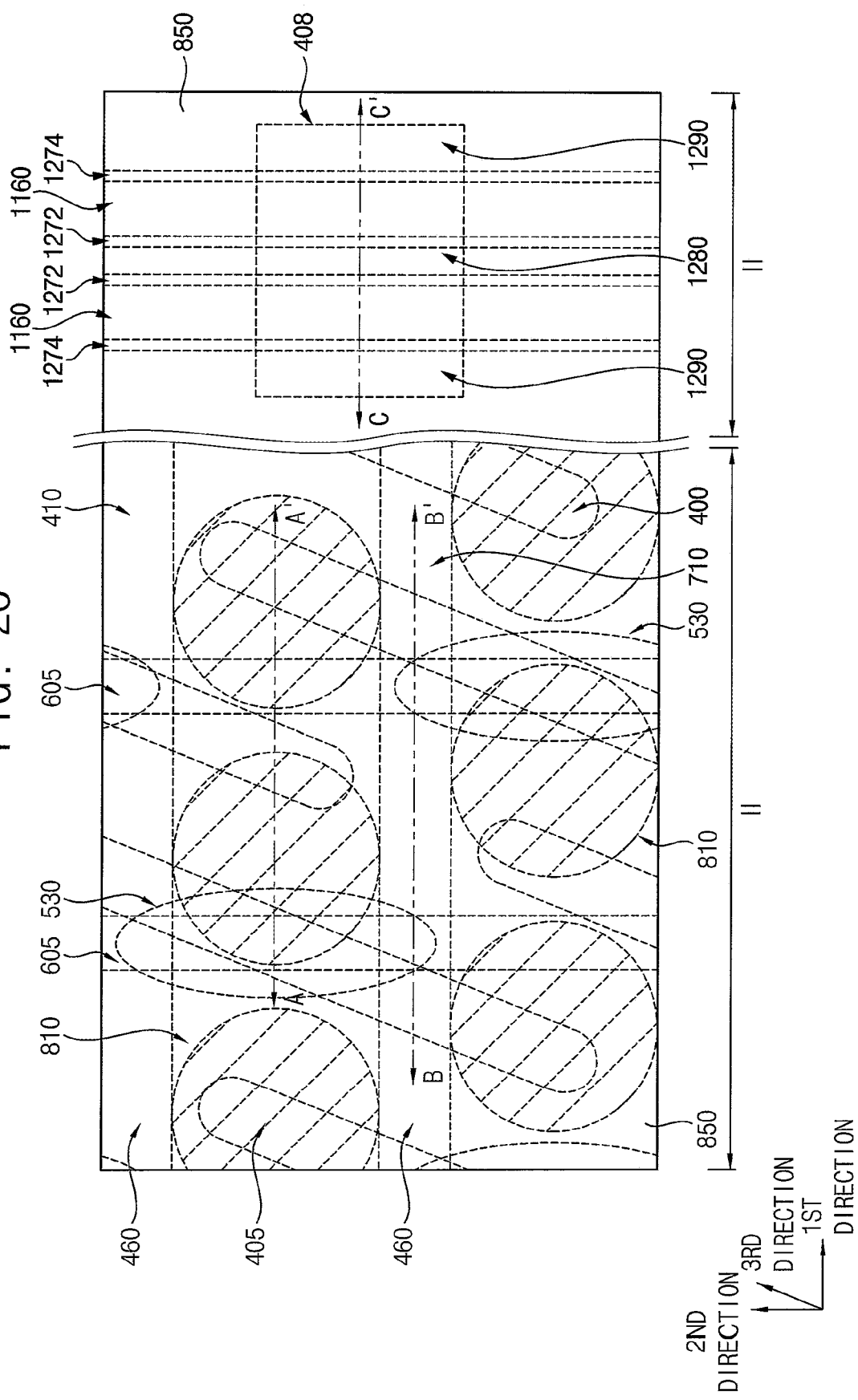
Figure 27:
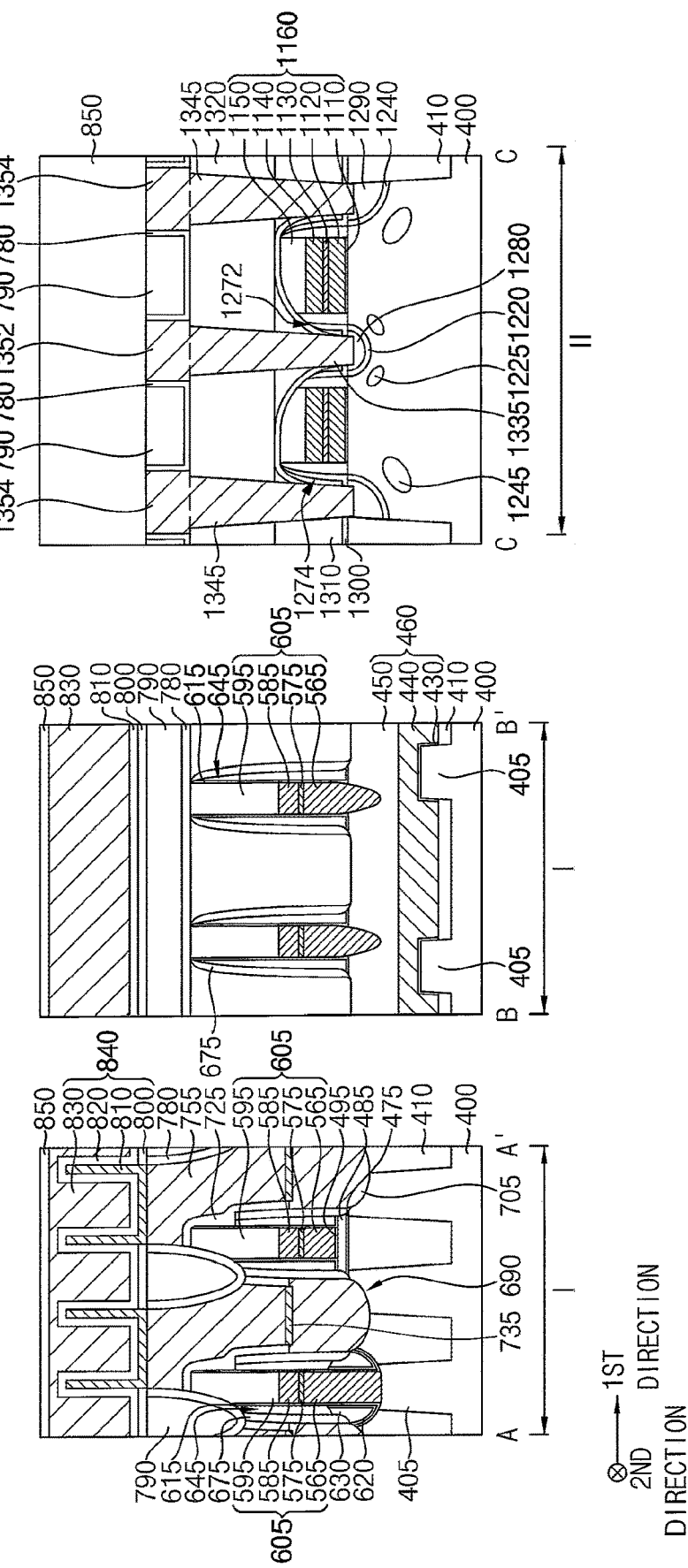

Referring to FIGS. 26 and 27, a capacitor 840 may be formed to physically contact the upper surface of the upper contact plug 755.

Particularly, a third etch stop layer 800 and a mold layer (not shown) may be sequentially formed on the upper contact plug 755, and the third and fourth insulating interlayers 780 and 790, and the first and second wirings 1352 and 1354, and partially etched to form a ninth opening partially exposing the upper surface of the upper contact plug 755. The third etch stop layer 800 may include a nitride, e.g., silicon nitride.

A lower electrode layer (not shown) may be formed on a sidewall of the ninth opening, the exposed upper surface of the upper contact plug 755 and the mold layer, a second sacrificial layer (not shown) may be formed on the lower electrode layer to at least partially fill the ninth opening, and the lower electrode layer and the second sacrificial layer may be planarized until an upper surface of the mold layer is exposed to divide the lower electrode layer. The second sacrificial layer and the mold layer may be removed by, e.g., a wet etching process, and thus a lower electrode 810 having a cylindrical shape may be formed on the exposed upper surface of the upper contact plug 755. In other embodiments, the lower electrode 810 may have a pillar shape at least partially filling the ninth opening. The lower electrode 810 may include, e.g., a metal, a metal nitride, etc.

A dielectric layer 820 may be formed on a surface of the lower electrode 810 and the third etch stop layer 800, and an upper electrode 830 may be formed on the dielectric layer 820 so that the capacitor 840 including the lower electrode 810, the dielectric layer 820 and the upper electrode 830 may be formed.

The dielectric layer 820 may include, e.g., a metal oxide, and the upper electrode 830 may include, e.g., a metal, a metal nitride, etc.

A fifth insulating interlayer 850 may be formed to at least partially cover the capacitor 840 on the first and second regions I and II of the substrate 400 to complete the fabrication of the semiconductor device. The fifth insulating interlayer 850 may include an oxide, e.g., silicon oxide.

The semiconductor device manufactured by the above processes may have various structural characteristics, which will be described with reference to FIGS. 26 and 27.

The semiconductor device may include the first and second active patterns 405 and 408 on the cell region I and the peripheral circuit region II bordering or surrounding the circuit region I, respectively, of the substrate 400, the fourth gate structure 460 being buried at an upper portion of the first active pattern 405 and extending in the first direction, the bit line structure 605 physically contacting a central upper surface in the third direction of the first active pattern 405 and extending in the second direction, the lower contact plug structure 705, 735 and 755 contacting each edge upper surface in the third direction of the first active pattern 405, the capacitor 840 on the lower contact plug structure 705, 735 and 755, the fifth gate structure 1160 extending in the second direction on the second active pattern 408, the first and second spacer structures 1272 and 1274 on first and second sidewalls, respectively, opposite in the first direction of the fifth gate structure 1160, and the first and second source/drain layers at upper portions of the second active pattern 408 adjacent to the first and second sidewalls, respectively, of the fifth gate structure 1160. The upper surface of the fifth gate structure 1160 may have a height gradually decreasing from the central portion to the first sidewall in the first direction, and may have a height substantially constant from the central portion to the second sidewall in the cross-sectional view of FIG. 27.

In example embodiments, the uppermost surface of the first spacer structure 1272 may be lower than the uppermost surface of the second spacer structure 1274 in the cross-sectional view of FIG. 27.

In example embodiments, the first spacer structure 1272 may include the first spacer 1172, the first etch stop pattern 1182 and the third spacer 1262 sequentially stacked in the horizontal direction from the first sidewall of the fifth gate structure 1160, and the second spacer structure 1274 may include the second spacer 1174, the second etch stop pattern 1184 and the fourth spacer 1264 sequentially stacked in the horizontal direction from the second sidewall of the fifth gate structure 1160 in the cross-sectional view of FIG. 27.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
a gate structure on a substrate;
first and second spacer structures on first and second sidewalls, respectively, opposite to each other of the gate structure; and
first and second source/drain layers at upper portions of the substrate adjacent to the first and second sidewalls, respectively, of the gate structure,
wherein an upper surface of the gate structure has a height with reference to an upper surface of the substrate being a base level decreasing from a central portion to the first sidewall and substantially constant from the central portion to the second sidewall,
wherein the first spacer structure includes a first spacer, a first etch stop pattern, and a third spacer sequentially stacked from the first sidewall of the gate structure in a direction substantially parallel to the upper surface of the substrate,
wherein the second spacer structure includes a second spacer, a second etch stop pattern, and a fourth spacer sequentially stacked from the second sidewall of the gate structure in the direction substantially parallel to the upper surface of the substrate,
wherein each of the first and second spacers includes silicon oxide or a metal oxide, and a cross-section of each of the first and second etch stop patterns has an "L" shape, and
wherein an uppermost surface of the second etch stop pattern is substantially coplanar with an uppermost surface of the gate structure.

2. The semiconductor device according to claim 1, wherein the gate structure includes a gate insulation pattern, a first conductive pattern, a diffusion barrier, a second conductive pattern, and a gate mask sequentially stacked on the substrate, wherein an upper surface of the gate mask has a height with reference to the upper surface of the substrate being the base level decreasing from a central portion to the first sidewall of the gate structure and substantially constant from the central portion to the second sidewall of the gate structure, and wherein an upper surface of the second conductive pattern has a height with reference to the upper surface of the substrate being the base level substantially constant between the first and second sidewalls of the gate structure.

3. The semiconductor device according to claim 2, wherein the first conductive pattern includes doped polysilicon, the diffusion barrier includes a metal silicon nitride, the second conductive pattern includes a metal, and the gate mask includes silicon nitride.

4. The semiconductor device according to claim 1, wherein the first and second spacer structures are not symmetrical with each other and have different shapes from each other.

5. The semiconductor device according to claim 1, wherein an uppermost surface of the first spacer structure is lower than an uppermost surface of the second spacer structure with reference to the upper surface of the substrate being the base level.

6. The semiconductor device according to claim 5, wherein an upper surface of the first spacer structure gradually decreases in height as a distance in a direction substantially parallel to the upper surface of the substrate from the first sidewall of the gate structure increases with reference to the upper surface of the substrate being the base level.

7. The semiconductor device according to claim 1, wherein each of the first and second spacers includes silicon nitride, and each of the third and fourth spacers includes silicon oxide.

8. The semiconductor device according to claim 1, wherein each of the first and second spacers includes silicon nitride, and each of the third and fourth spacers includes silicon oxide.

9. The semiconductor device according to claim 1, wherein each of the first and second source/drain layers includes:
   a first impurity region including impurities having a first concentration; and
   a second impurity region including impurities having a second concentration greater than the first concentration, the second impurity region being in the first impurity region.

10. A semiconductor device comprising:
   first, second and third gate structures spaced apart from each other on a substrate;
   first and second spacer structures on first and second sidewalls, respectively, opposite to each other of each of the first, second, and third gate structures; and
   first, second, third, and fourth source/drain layers at upper portions of the substrate between the first and second gate structures, between the second and third gate structures, at one side of the first gate structure, and at one side of the third gate structure, respectively,
   wherein the first and second gate structures are spaced apart from each other by a first distance, and the second and third gate structures are spaced apart from each other by a second distance greater than the first distance,
   wherein an uppermost surface of the first spacer structure on the first sidewall of the second gate structure facing the first gate structure is lower than an uppermost surface of the second spacer structure on the second sidewall of the second gate structure with reference to an upper surface of the substrate being a base level, and
   wherein an uppermost surface of the first spacer structure on the first sidewall of the first gate structure facing the second gate structure is lower than an uppermost surface of the second spacer structure on the second sidewall of the first gate structure with reference to the upper surface of the substrate being the base level.

11. The semiconductor device according to claim 10, wherein an upper surface of the second gate structure has a height with reference to the upper surface of the substrate being the base level decreasing from a central portion to the first sidewall thereof, and substantially constant from the central portion to the second sidewall thereof.

12. The semiconductor device according to claim 10, wherein an upper surface of the first gate structure has a height with reference to the upper surface of the substrate being the base level decreasing from a central portion to the first sidewall of the first gate structure, and substantially constant from the central portion to the second sidewall of the first gate structure.

13. The semiconductor device according to claim 10, wherein the second spacer structure on the second sidewall of the third gate structure facing the second gate structure is symmetrical with the second spacer structure on the second sidewall of the second gate structure.

14. The semiconductor device according to claim 10, wherein each of the first and second spacer structures includes a first spacer, an etch stop pattern and a second spacer sequentially stacked from each of the first and second sidewalls of each of the first to third gate structures in a direction substantially parallel to the upper surface of the substrate, and
   wherein the first spacer includes silicon nitride, the etch stop pattern includes silicon oxide or a metal oxide, and the second spacer includes silicon oxide.

15. A semiconductor device comprising:
   first and second active patterns on a cell region and a peripheral circuit region, respectively, of a substrate, the peripheral circuit region surrounding the cell region in a plan view of the semiconductor device;
   a first gate structure buried at an upper portion of the first active pattern;
   a bit line structure physically contacting a central upper surface of the first active pattern;
   a contact plug structure physically contacting each of opposite edge upper surfaces of the first active pattern;
   a capacitor on the contact plug structure;
   a second gate structure on the second active pattern;
   first and second spacer structures on first and second sidewalls, respectively, opposite to each other of the second gate structure; and
   first and second source/drain layers at upper portions of the substrate adjacent to the first and second sidewalls, respectively, of the second gate structure,
   wherein an upper surface of the second gate structure has a height with reference to an upper surface of the substrate being a base level decreasing from a central portion to the first sidewall and substantially constant from the central portion to the second sidewall,
   wherein the first spacer structure includes a first spacer, a first etch stop pattern, and a third spacer sequentially stacked from the first sidewall of the gate structure in a direction substantially parallel to the upper surface of the substrate, wherein the second spacer structure includes a second spacer, a second etch stop pattern, and a fourth spacer sequentially stacked from the second sidewall of the gate structure in the direction substantially parallel to the upper surface of the substrate, wherein each of the first and second spacers includes silicon oxide or a metal oxide, and a cross-section of each of the first and second etch stop patterns has an "L" shape, and wherein an uppermost surface of the second etch stop pattern is substantially coplanar with an uppermost surface of the gate structure.

16. The semiconductor device according to claim 15, wherein an uppermost surface of the first spacer structure is lower than an uppermost surface of the second spacer structure with reference to the upper surface of the substrate being the base level.

17. The semiconductor device according to claim 15, wherein each of the first and second spacers includes silicon nitride, and each of the third and fourth spacers includes silicon oxide.

\* \* \* \* \*